United States Patent
Hayashi

(10) Patent No.: US 8,989,512 B2
(45) Date of Patent: Mar. 24, 2015

(54) SYMMETRIC FILTER ARITHMETIC APPARATUS AND SYMMETRIC FILTER ARITHMETIC METHOD

(75) Inventor: Yoshiteru Hayashi, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 136 days.

(21) Appl. No.: 13/818,198

(22) PCT Filed: Jul. 25, 2012

(86) PCT No.: PCT/JP2012/004729
§ 371 (c)(1),
(2), (4) Date: Feb. 21, 2013

(87) PCT Pub. No.: WO2013/031083
PCT Pub. Date: Mar. 7, 2013

(65) Prior Publication Data
US 2014/0219577 A1    Aug. 7, 2014

(30) Foreign Application Priority Data

Sep. 2, 2011    (JP) .................................. 2011-192060

(51) Int. Cl.
*G06K 9/40* (2006.01)
*G06F 17/10* (2006.01)
*G06T 5/10* (2006.01)
*H03H 17/02* (2006.01)

(52) U.S. Cl.
CPC .......... *G06T 5/10* (2013.01); *G06T 2207/20024* (2013.01); *G06F 17/10* (2013.01); *H03H 17/0202* (2013.01)
USPC .......................................... 382/260; 708/300

(58) Field of Classification Search
CPC ... G06T 5/10; G06T 2207/20024; G06T 1/00; G06T 1/60; H03H 17/0223; H03H 17/06; H03H 17/0202; H03H 17/0229; G06F 17/10

USPC .......................................... 382/260; 708/300
See application file for complete search history.

(56) References Cited

U.S. PATENT DOCUMENTS

| | | | |
|---|---|---|---|
| 5,034,907 A * | 7/1991 | Johnson et al. ................ | 708/319 |
| 6,279,020 B1 | 8/2001 | Dujardin et al. | |
| 7,492,848 B2 * | 2/2009 | Gurrapu ......................... | 375/355 |
| 8,260,075 B2 * | 9/2012 | Inoue et al. .................... | 382/260 |
| 8,346,833 B2 * | 1/2013 | Lin et al. ........................ | 708/300 |
| 2010/0046851 A1 | 2/2010 | Inoue et al. | |

FOREIGN PATENT DOCUMENTS

| | | |
|---|---|---|
| JP | 11-266140 | 9/1999 |
| JP | 2000-124773 | 4/2000 |
| JP | 2006-319941 | 11/2006 |
| WO | 2007/072644 | 6/2007 |

OTHER PUBLICATIONS

International Search Report issued Oct. 30, 2012 in corresponding International Application No. PCT/JP2012/004729.

* cited by examiner

*Primary Examiner* — Kanjibhai Patel
(74) *Attorney, Agent, or Firm* — Wenderoth, Lind & Ponack, L.L.P.

(57) ABSTRACT

A symmetric filter arithmetic apparatus includes a first data shuffling unit which reads a first data string that is a plurality of consecutive pieces of data from a register file and extract, from the first data string, a left-side data string that is a plurality of consecutive pieces of data to be multiplied by a left-side filter coefficient that is a filter coefficient on a left side of a center of the coefficients, and a second data shuffling unit which reads a second data string that is a plurality of consecutive pieces of data from the register file and extract, from the second data string, a right-side data string that is a plurality of consecutive pieces of data to be multiplied by a right-side filter coefficient that is a filter coefficient on a right side of the center and is the same value as the left-side filter coefficient.

8 Claims, 25 Drawing Sheets

FIG. 3A

| Input of port A | [ a0, a1, a2, a3, a4, a5, a6, a7 ] |
|---|---|
| Input of port B | [ b0, b1, b2, b3, b4, b5, b6, b7 ] |

FIG. 3B

| Input of port X1 of first data shuffling unit | [ a0, a1, a2, a3, a4, a5, a6, a7 ] |
|---|---|
| Input of port Y1 of first data shuffling unit | [ b0, b1, b2, b3, b4, b5, b6, b7 ] |
| Input of port X2 of second data shuffling unit | [ a0, a1, a2, a3, a4, a5, a6, a7 ] |
| Input of port Y2 of second data shuffling unit | [ b0, b1, b2, b3, b4, b5, b6, b7 ] |

FIG. 3C

| Execution control signal | Output of first data shuffling unit | Output of second data shuffling unit |
|---|---|---|
| 0 | [ a0, a1, a2, a3, a4, a5, a6, a7 ] | [ a7, b0, b1, b2, b3, b4, b5, b6 ] |
| 1 | [ a1, a2, a3, a4, a5, a6, a7, b0 ] | [ a6, a7, b0, b1, b2, b3, b4, b5 ] |
| 2 | [ a2, a3, a4, a5, a6, a7, b0, b1 ] | [ a5, a6, a7, b0, b1, b2, b3, b4 ] |
| 3 | [ a3, a4, a5, a6, a7, b0, b1, b2 ] | [ a4, a5, a6, a7, b0, b1, b2, b3 ] |
| 4 | [ a0, a1, a2, a3, a4, a5, a6, a7 ] | [ b0, b1, b2, b3, b4, b5, b6, b7 ] |
| 5 | [ a1, a2, a3, a4, a5, a6, a7, b0 ] | [ a7, b0, b1, b2, b3, b4, b5, b6 ] |
| 6 | [ a2, a3, a4, a5, a6, a7, b0, b1 ] | [ a6, a7, b0, b1, b2, b3, b4, b5 ] |
| 7 | [ a3, a4, a5, a6, a7, b0, b1, b2 ] | [ a5, a6, a7, b0, b1, b2, b3, b4 ] |

FIG. 4

Mnemonics (a-1) valnadd.8      Rc, Ra, Rb, I3
(a-2) valnadd.8s     Rc, Ra, Rb, I3
(a-3) valnadd.8l     Rc: Rc+1, Ra, Rb, I3
(b)   valn.8         Rc, Rc+1, Ra, Rb, I3

Instruction code

| Opcode (12bit) | Shuffle pattern (3bit) | Element width (2bit) | Ra (5bit) | Rb (5bit) | Rc (5bit) |
|---|---|---|---|---|---|

FIG. 6

| Number of filter taps | Input data of R0 and R1 | Instruction |
|---|---|---|
| 2 | R0 ← [ p-3, p-2, p-1, p0, p1, p2, p3, p4 ]<br>R1 ← [ p5, p6, p7, p8, p9, p10, p11, p12 ] | valnadd.8 R2, R0, R1, 3 |
| 3 | | valnadd.8 R2, R0, R1, 7 |
| 4 | R0 ← [ p-2, p-1, p0, p1, p2, p3, p4, p5 ]<br>R1 ← [ p6, p7, p8, p9, p10, p11, p12, p13 ] | valnadd.8 R2, R0, R1, 2<br>valnadd.8 R3, R0, R1, 3 |
| 5 | | valnadd.8 R2, R0, R1, 6<br>valnadd.8 R3, R0, R1, 7 |
| 6 | R0 ← [ p-1, p0, p1, p2, p3, p4, p5, p6 ]<br>R1 ← [ p7, p8, p9, p10, p11, p12, p13, p14 ] | valnadd.8 R2, R0, R1, 1<br>valnadd.8 R3, R0, R1, 2<br>valnadd.8 R4, R0, R1, 3 |
| 7 | | valnadd.8 R2, R0, R1, 5<br>valnadd.8 R3, R0, R1, 6<br>valnadd.8 R4, R0, R1, 7 |
| 8 | R0 ← [ p0, p1, p2, p3, p4, p5, p6, p7 ]<br>R1 ← [ p8, p9, p10, p11, p12, p13, p14, p15 ] | valnadd.8 R2, R0, R1, 0<br>valnadd.8 R3, R0, R1, 1<br>valnadd.8 R4, R0, R1, 2<br>valnadd.8 R5, R0, R1, 3 |
| 9 | | valnadd.8 R2, R0, R1, 4<br>valnadd.8 R3, R0, R1, 5<br>valnadd.8 R4, R0, R1, 6<br>valnadd.8 R5, R0, R1, 7 |

FIG. 8

$q0 = k0 \times (p0 + p5) + k1 \times (p1 + p4) + k2 \times (p2 + p3)$
$q1 = k0 \times (p1 + p6) + k1 \times (p2 + p5) + k2 \times (p3 + p4)$
$q2 = k0 \times (p2 + p7) + k1 \times (p3 + p6) + k2 \times (p4 + p5)$
$q3 = k0 \times (p3 + p8) + k1 \times (p4 + p7) + k2 \times (p5 + p6)$
$q4 = k0 \times (p4 + p9) + k1 \times (p5 + p8) + k2 \times (p6 + p7)$
$q5 = k0 \times (p5 + p10) + k1 \times (p6 + p9) + k2 \times (p7 + p8)$
$q6 = k0 \times (p6 + p11) + k1 \times (p7 + p10) + k2 \times (p8 + p9)$
$q7 = k0 \times (p7 + p12) + k1 \times (p8 + p11) + k2 \times (p9 + p10)$

R2, R3, R4

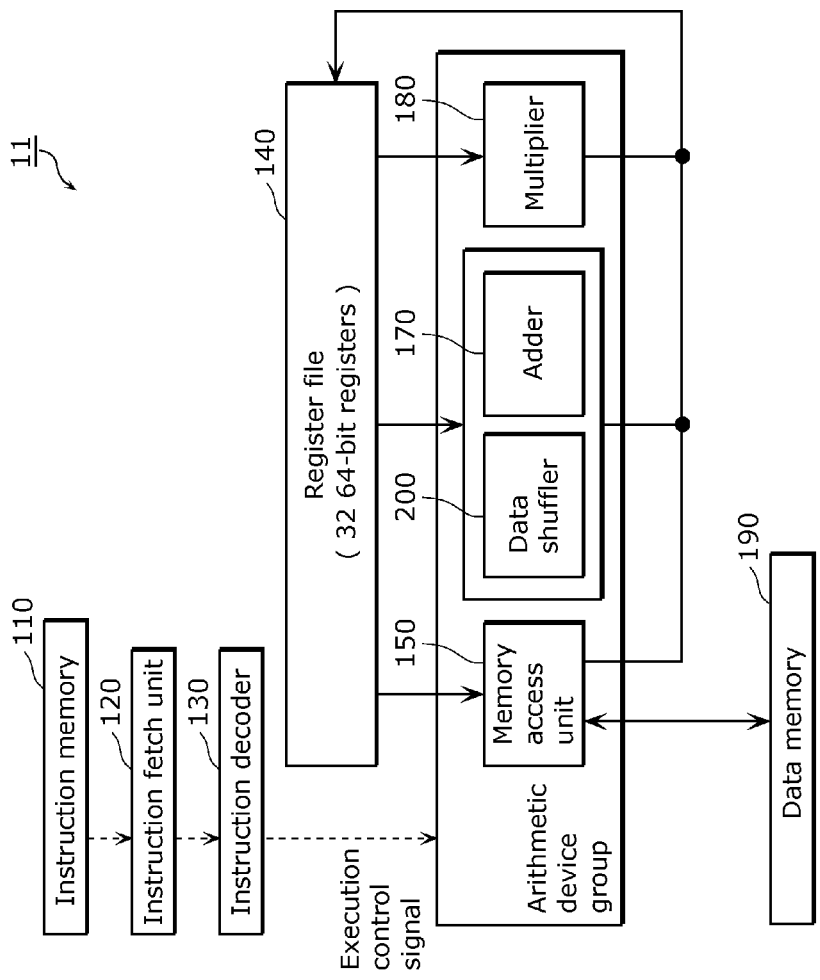

| Input of port A | [ a0, a1, a2, a3, a4, a5, a6, a7 ] |
|---|---|
| Input of port B | [ b0, b1, b2, b3, b4, b5, b6, b7 ] |
| Input of port C | No input |
| Input of port D | No input |

FIG. 13A

| Input of port A | [ a0, a1, a2, a3, a4, a5, a6, a7 ] |
|---|---|
| Input of port B | [ b0, b1, b2, b3, b4, b5, b6, b7 ] |
| Input of port C | [ c0, c1, c2, c3, c4, c5, c6, c7 ] |
| Input of port D | [ d0, d1, d2, d3, d4, d5, d6, d7 ] |

FIG. 13B

| | |
|---|---|
| Input of port X10 of first data shuffling unit | [ a0, a1, a2, a3, a4, a5, a6, a7 ] |
| Input of port Y10 of first data shuffling unit | [ b0, b1, b2, b3, b4, b5, b6, b7 ] |
| Input of port X11 of first data shuffling unit | [ c0, c1, c2, c3, c4, c5, c6, c7 ] |
| Input of port Y11 of first data shuffling unit | [ d0, d1, d2, d3, d4, d5, d6, d7 ] |
| Input of port X20 of second data shuffling unit | [ a0, a1, a2, a3, a4, a5, a6, a7 ] |
| Input of port Y20 of second data shuffling unit | [ b0, b1, b2, b3, b4, b5, b6, b7 ] |
| Input of port X21 of second data shuffling unit | [ c0, c1, c2, c3, c4, c5, c6, c7 ] |
| Input of port Y21 of second data shuffling unit | [ d0, d1, d2, d3, d4, d5, d6, d7 ] |

FIG. 13C

| Execution control signal | Output of first data shuffling unit | Output of second data shuffling unit |
|---|---|---|
| 8 | [ a0, a1, a2, a3, a4, a5, a6, a7 ] | [ c7, d0, d1, d2, d3, d4, d5, d6 ] |
| 9 | [ a1, a2, a3, a4, a5, a6, a7, b0 ] | [ c6, c7, d0, d1, d2, d3, d4, d5 ] |
| 10 | [ a2, a3, a4, a5, a6, a7, b0, b1 ] | [ c5, c6, c7, d0, d1, d2, d3, d4 ] |
| 11 | [ a3, a4, a5, a6, a7, b0, b1, b2 ] | [ c4, c5, c6, c7, d0, d1, d2, d3 ] |
| 12 | [ a4, a5, a6, a7, b0, b1, b2, b3 ] | [ c3, c4, c5, c6, c7, d0, d1, d2 ] |
| 13 | [ a5, a6, a7, b0, b1, b2, b3, b4 ] | [ c2, c3, c4, c5, c6, c7, d0, d1 ] |
| 14 | [ a6, a7, b0, b1, b2, b3, b4, b5 ] | [ c1, c2, c3, c4, c5, c6, c7, d0 ] |
| 15 | [ a7, b0, b1, b2, b3, b4, b5, b6 ] | [ c0, c1, c2, c3, c4, c5, c6, c7 ] |
| 16 | [ a0, a1, a2, a3, a4, a5, a6, a7 ] | [ d0, d1, d2, d3, d4, d5, d6, d7 ] |
| 17 | [ a1, a2, a3, a4, a5, a6, a7, b0 ] | [ c7, d0, d1, d2, d3, d4, d5, d6 ] |
| 18 | [ a2, a3, a4, a5, a6, a7, b0, b1 ] | [ c6, c7, d0, d1, d2, d3, d4, d5 ] |
| 19 | [ a3, a4, a5, a6, a7, b0, b1, b2 ] | [ c5, c6, c7, d0, d1, d2, d3, d4 ] |
| 20 | [ a4, a5, a6, a7, b0, b1, b2, b3 ] | [ c4, c5, c6, c7, d0, d1, d2, d3 ] |
| 21 | [ a5, a6, a7, b0, b1, b2, b3, b4 ] | [ c3, c4, c5, c6, c7, d0, d1, d2 ] |
| 22 | [ a6, a7, b0, b1, b2, b3, b4, b5 ] | [ c2, c3, c4, c5, c6, c7, d0, d1 ] |
| 23 | [ a7, b0, b1, b2, b3, b4, b5, b6 ] | [ c1, c2, c3, c4, c5, c6, c7, d0 ] |

FIG. 15

Mnemonics (a-1)  valnpadd.8      Rc, Ra, Ra+1, Rb, Rb+1, I3
(a-2)  valnpadd.8s     Rc, Ra, Ra+1, Rb, Rb+1, I3
(a-3)  valnpadd.8l     Rc: Rc+1, Ra, Ra+1, Rb, Rb+1, I3
(b)    valnp.8         Rc, Rc+1, Ra, Ra+1, Rb, Rb+1, I3

Instruction code

| Opcode (11bit) | Shuffle pattern (4bit) | Element width (2bit) | Ra (5bit) | Rb (5bit) | Rc (5bit) |
| --- | --- | --- | --- | --- | --- |

FIG. 17

$q0 = k0 \times (p0 + p15) + k1 \times (p1 + p14) + k2 \times (p2 + p13) + k3 \times (p3 + p12) + k4 \times (p4 + p11) + k5 \times (p5 + p10) + k6 \times (p6 + p9) + k7 \times (p7 + p8)$ $q1 = k0 \times (p1 + p16) + k1 \times (p2 + p15) + k2 \times (p3 + p14) + k3 \times (p4 + p13) + k4 \times (p5 + p12) + k5 \times (p6 + p11) + k6 \times (p7 + p10) + k7 \times (p8 + p9)$

..

$q7 = k0 \times (p7 + p22) + k1 \times (p8 + p21) + k2 \times (p9 + p20) + k3 \times (p10 + p19) + k4 \times (p11 + p18) + k5 \times (p12 + p17) + k6 \times (p13 + p16) + k7 \times (p14 + p15)$

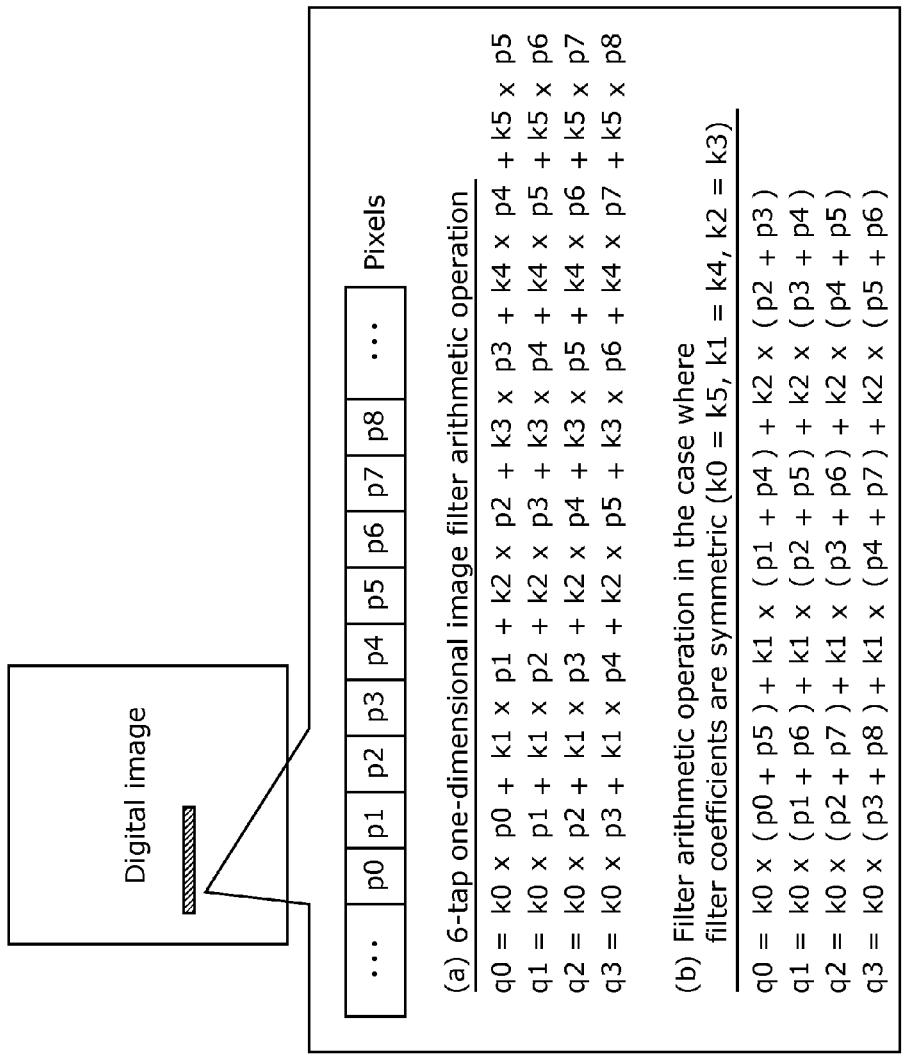

(a) 6-tap one-dimensional image filter arithmetic operation $q0 = k0 \times p0 + k1 \times p1 + k2 \times p2 + k3 \times p3 + k4 \times p4 + k5 \times p5$
$q1 = k0 \times p1 + k1 \times p2 + k2 \times p3 + k3 \times p4 + k4 \times p5 + k5 \times p6$
$q2 = k0 \times p2 + k1 \times p3 + k2 \times p4 + k3 \times p5 + k4 \times p6 + k5 \times p7$
$q3 = k0 \times p3 + k1 \times p4 + k2 \times p5 + k3 \times p6 + k4 \times p7 + k5 \times p8$ (b) Filter arithmetic operation in the case where filter coefficients are symmetric (k0 = k5, k1 = k4, k2 = k3)

$q0 = k0 \times (p0 + p5) + k1 \times (p1 + p4) + k2 \times (p2 + p3)$
$q1 = k0 \times (p1 + p6) + k1 \times (p2 + p5) + k2 \times (p3 + p4)$
$q2 = k0 \times (p2 + p7) + k1 \times (p3 + p6) + k2 \times (p4 + p5)$
$q3 = k0 \times (p3 + p8) + k1 \times (p4 + p7) + k2 \times (p5 + p6)$

SYMMETRIC FILTER ARITHMETIC APPARATUS AND SYMMETRIC FILTER ARITHMETIC METHOD

TECHNICAL FIELD

The present invention relates to a symmetric filter arithmetic apparatus and a symmetric filter arithmetic method that perform a filter arithmetic operation by using bilaterally symmetric filter coefficients.

BACKGROUND ART

A filter arithmetic operation is one of the arithmetic operations used in various types of image processing, in which, in the case of a filter arithmetic operation of image data, filter coefficients are multiplied by the pixel values of the image data and the results are cumulatively added. Here, conventionally, a symmetric filter arithmetic apparatus has been proposed that performs a symmetric image filter arithmetic operation (hereinafter referred to as a "symmetric filter arithmetic operation") that is a filter arithmetic operation in the case where the filter coefficients are symmetric (see, for example, Patent Literature (PTL) 1).

CITATION LIST

Patent Literature

[PTL 1] WO 2007/072644

SUMMARY OF INVENTION

However, the conventional symmetric filter arithmetic apparatus is configured as a dedicated arithmetic device that fixedly performs only symmetric filter arithmetic operations, and PTL 1 is silent on the operations and configuration in the case where symmetric filter arithmetic operations are performed with a processor. Also, the conventional symmetric filter arithmetic apparatus is customized for symmetric filter arithmetic operations with 6 taps, and PTL 1 is silent on the case of performing symmetric filter arithmetic operations with a number of taps other than 6.

The present invention has been made to solve the above conventional problems, and it is an object of the present invention to provide a symmetric filter arithmetic apparatus and a symmetric filter arithmetic method that can perform symmetric filter arithmetic operations corresponding to various numbers of taps by using a processor.

In order to achieve the above object, a symmetric filter arithmetic apparatus according to one aspect of the present invention is a symmetric filter arithmetic apparatus that performs a filter arithmetic operation on a plurality of pieces of data stored in a storage unit by using bilaterally symmetric filter coefficients, the apparatus including: a left-side data string extraction unit configured to read, from the storage unit, a first data string that is a plurality of consecutive pieces of data, and extract, from the first data string, a left-side data string that is a plurality of consecutive pieces of data to be multiplied by a left-side filter coefficient that is a filter coefficient on a left side of a center of the bilaterally symmetric filter coefficients; and a right-side data string extraction unit configured to read, from the storage unit, a second data string that is a plurality of consecutive pieces of data, and extract, from the second data string, a right-side data string that is a plurality of consecutive pieces of data to be multiplied by a right-side filter coefficient that is a filter coefficient on a right side of the center and is the same value as the left-side filter coefficient.

These general and specific aspects may be implemented using a system, a method, an integrated circuit, a computer program, or a computer-readable recording medium such as a CD-ROM, or any combination of apparatuses, systems, methods, integrated circuits, computer programs, or recording media.

According to the symmetric filter arithmetic apparatus of the present invention, it is possible to perform symmetric filter arithmetic operations corresponding to various numbers of taps by using a processor.

BRIEF DESCRIPTION OF DRAWINGS

FIG. 3A is a diagram illustrating an operation of the data shuffler according to Embodiment 1 of the present invention.

FIG. 3B is a diagram illustrating the operation of the data shuffler according to Embodiment 1 of the present invention.

FIG. 3C is a diagram illustrating the operation of the data shuffler according to Embodiment 1 of the present invention.

FIG. 4 is a diagram showing mnemonics and an instruction code for operating the data shuffler according to Embodiment 1 of the present invention.

FIG. 6 is a diagram showing instructions for the filter arithmetic apparatus to perform symmetric filter arithmetic operations according to Embodiment 1 of the present invention.

FIG. 8 is a diagram illustrating the symmetric filter arithmetic operation performed by the filter arithmetic apparatus according to Embodiment 1 of the present invention.

FIG. 10 is a diagram showing a configuration of a filter arithmetic apparatus according to Embodiment 2 of the present invention.

FIG. 13A is a diagram illustrating the operation of the data shuffler according to Embodiment 2 of the present invention.

FIG. 13B is a diagram illustrating the operation of the data shuffler according to Embodiment 2 of the present invention.

FIG. 13C is a diagram illustrating the operation of the data shuffler according to Embodiment 2 of the present invention.

FIG. 15 is a diagram showing mnemonics and an instruction code for operating the data shuffler according to Embodiment 2 of the present invention.

FIG. 17 is a diagram illustrating the symmetric filter arithmetic operation performed by the filter arithmetic apparatus according to Embodiment 2 of the present invention.

FIG. 20 is a diagram showing the content of a 6-tap one-dimensional image filter arithmetic operation.

DETAILED DESCRIPTION OF INVENTION (Underlying Knowledge Forming Basis of the Present Invention)

The present inventors found that the following problems occur in the conventional symmetric filter arithmetic apparatus mentioned in the Background Art.

FIG. 20 is a diagram showing the content of a 6-tap one-dimensional image filter arithmetic operation (filter arithmetic operation). p0 to p8 are pixel values of nine consecutive pixels, and k0 to k5 are filter coefficients used in the filter arithmetic operation.

As shown in (a) of FIG. 20, in the 6-tap filter arithmetic operation, the pixels p0 to p5 are respectively multiplied by the filter coefficients k0 to k5, and the results are cumulatively added to obtain a filter result q0. Next, the same filter arithmetic operation is performed on the pixels p1 to p6 shifted by one pixel to obtain a filter result q1, and then on the pixels p2 to p7 to obtain a filter result q2, and then on the pixels p3 to p8 to obtain a filter result q3. In this way, the filter arithmetic operation is performed by shifting by one pixel each time, whereby the filter arithmetic operation can be performed on the entire image.

At this time, in the case where k0 and k5 are equal, k1 and k4 are equal, and k2 and k3 are equal, such a state is referred to as the filter coefficients being symmetric. The filter arithmetic operation performed in this case is referred to as a symmetric image filter arithmetic operation (symmetric filter arithmetic operation). In the symmetric filter arithmetic operation, as shown in (b) of FIG. 20, the pixels to be multiplied by the same filter coefficient are added up in advance, and the result is multiplied by the filter coefficient, whereby the number of multiplications can be reduced and the processing can be speeded up. Such a method is disclosed in, for example, PTL 1.

Figure 21:
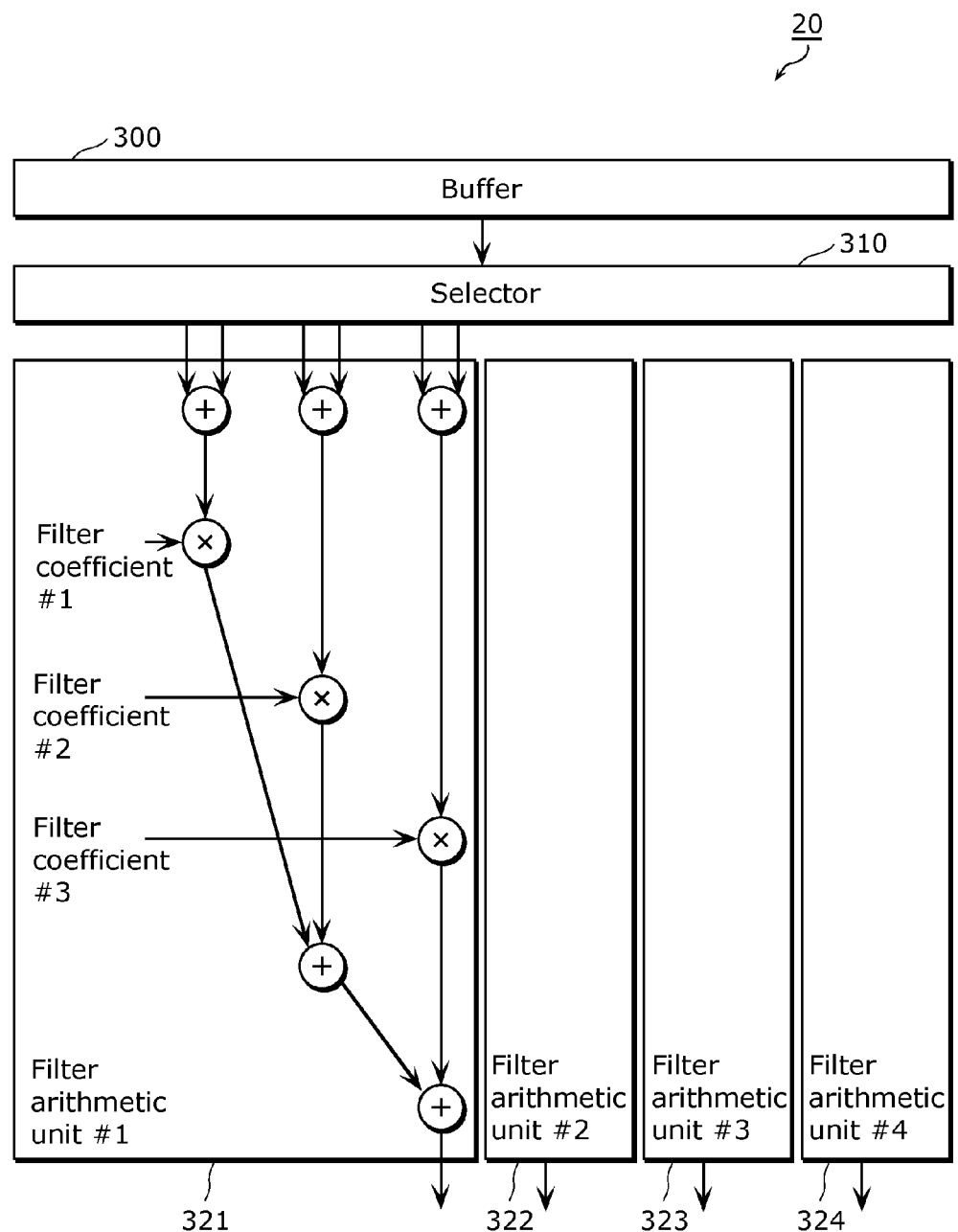
FIG. 21 is a diagram showing a configuration of a conventional symmetric filter arithmetic apparatus.

FIG. 21 is a diagram showing a configuration of a conventional symmetric filter arithmetic apparatus disclosed in PTL 1. In the symmetric filter arithmetic apparatus 20 shown in the diagram, pixels are read from a buffer 300, pixels having symmetric filter coefficients are selected by a selector 310, and a filter arithmetic operation is performed by four filter arithmetic units 321 to 324 (filter arithmetic units #1 to #4). The filter arithmetic units 321 to 324 all have the same configuration, and each of the filter arithmetic units 321 to 324 performs a 6-tap symmetric filter arithmetic operation on the pixels selected by the selector 310.

Each of the filter arithmetic units 321 to 324 firstly adds the pixel values of pixels having symmetric filter coefficients, and then multiplies the resultant values by the filter coefficient and cumulatively adds the results, as shown in (b) of FIG. 20. By simultaneously performing this filter arithmetic operation with the four filter arithmetic units 321 to 324, four filter arithmetic operation results can be obtained.

The conventional symmetric filter arithmetic apparatus is configured as a dedicated arithmetic device that fixedly performs only symmetric filter arithmetic operations, and PTL 1 is silent on the operations and configuration in the case where symmetric filter arithmetic operations are performed with a processor. Also, the conventional symmetric filter arithmetic apparatus is customized for symmetric filter arithmetic operations with 6 taps, and PTL 1 is silent on the case of performing symmetric filter arithmetic operations with a number of taps other than 6.

In order to solve this problem, a symmetric filter arithmetic apparatus according to one aspect of the present invention is a symmetric filter arithmetic apparatus that performs a filter arithmetic operation on a plurality of pieces of data stored in a storage unit by using bilaterally symmetric filter coefficients, the apparatus including: a left-side data string extraction unit configured to read, from the storage unit, a first data string that is a plurality of consecutive pieces of data, and extract, from the first data string, a left-side data string that is a plurality of consecutive pieces of data to be multiplied by a left-side filter coefficient that is a filter coefficient on a left side of a center of the bilaterally symmetric filter coefficients; and a right-side data string extraction unit configured to read, from the storage unit, a second data string that is a plurality of consecutive pieces of data, and extract, from the second data string, a right-side data string that is a plurality of consecutive pieces of data to be multiplied by a right-side filter coefficient that is a filter coefficient on a right side of the center and is the same value as the left-side filter coefficient.

With this configuration, the left-side data string is extracted from the first data string stored in the storage unit, and the right-side data string is extracted from the second data string stored in the storage unit. In other words, pairs of data strings that are multiplied by the same filter coefficient can be extracted. Accordingly, by extracting pairs of data strings corresponding to the number of taps, symmetric filter arithmetic operations corresponding to various numbers of taps can be performed with a processor.

Also, for example, the symmetric filter arithmetic apparatus may further include: an addition unit configured to calculate an addition data string by adding up the left-side data string and the right-side data string that have been extracted; and a multiplication unit configured to calculate a multiplication data string by multiplying the calculated addition data string by the left-side filter coefficient or the right-side filter coefficient.

With this configuration, the left-side data string and the right-side data string are added up and then multiplied by the left-side filter coefficient or the right-side filter coefficient. In other words, pairs of data strings that are multiplied by the same filter coefficient are added up and then multiplied by the filter coefficient. Accordingly, by performing addition and multiplication according to the number of taps, symmetric filter arithmetic operations corresponding to various numbers of taps can be performed with a processor.

Also, it is possible that, for example, the left-side data string extraction unit is configured to read, from the storage unit, the first data string including a third data string and a fourth data string that are consecutive data strings, and extract the left-side data string, and the right-side data string extraction unit is configured to: (a) read, from the storage unit, the second data string including a fifth data string and a sixth data string that are consecutive data strings, and extract the right-side data string, such that data positioned at a center of data string that is a center between head data of the third data string and tail data of the fifth data string is data to be multiplied by a filter coefficient at the center of the bilaterally symmetric filter coefficients; or (b) read, from the storage unit, the second data string including the consecutive fifth data string and sixth data string, and extract the right-side data string, such that data positioned at a center of data string that is a center between the head data of the third data string and head data of the sixth data string is data to be multiplied by the filter coefficient at the center of the bilaterally symmetric filter coefficients.

With this configuration, the left-side data string is extracted from the first data string including the consecutive third data string and fourth data string and the right-side data string is extracted from the second data string including the consecutive fifth data string and sixth data string, such that the data positioned at the center between the head data of the third data string and the tail data of the fifth data string is data to be multiplied by the central filter coefficient. Alternatively, the left-side data string and the right-side data string are extracted such that the data positioned at the center between the head data of the third data string and the head data of the sixth data string is data to be multiplied by the central filter coefficient. With this configuration, it is possible to extract the left-side data string and the right-side data string and perform the symmetric filter arithmetic operation by storing a part of the data in two buffers, in a manner whereby a first data string is stored in one of the buffers and a second data string is stored in the other buffer, and the left-side data string is extracted from the one buffer and the right-side data string is extracted from the other buffer.

Here, with the conventional configuration shown in FIG. 21, all of the pixel values of the pixels required to perform the filter arithmetic operation are stored in the buffer 300, and thus in the case where the number of taps of the symmetric filter arithmetic operation is large, the size of the buffer 300 increases. Accordingly, the conventional configuration is problematic in that when applied to a symmetric filter arithmetic operation having a large number of taps, the circuit scale of the symmetric filter arithmetic apparatus 20 needs to be increased.

In contrast, with the symmetric filter arithmetic apparatus of the present invention, even when the number of taps of the symmetric filter arithmetic operation is large, a part of the data is stored in two separate buffers. Accordingly, a symmetric filter arithmetic operation having a large number of taps can be performed without storing all of the data used in the symmetric filter arithmetic operation in a buffer, and therefore symmetric filter arithmetic operations corresponding to various numbers of taps can be performed by using a processor.

Also, it is possible that, for example, the left-side data string extraction unit is configured to extract the left-side data string headed by data on the left side of the center of data string, and the right-side data string extraction unit is configured to extract the right-side data string headed by data that is data on the right side of the center of data string and symmetric to the head data of the left-side data string with respect to the center of data string.

With this configuration, the left-side data string and the right-side data string are extracted such that the head data of the left-side data string and the head data of the right-side data string are bilaterally symmetric with respect to the center of data string. It is thereby possible to extract pairs of data strings that are multiplied by the same filter coefficient. Accordingly, by extracting pairs of data strings corresponding to the number of taps, symmetric filter arithmetic operations corresponding to various numbers of taps can be performed with a processor.

Also, it is possible that, for example, the third data string and the fourth data string, or the fifth data string and the sixth data string are stored in consecutive areas in the storage unit, the left-side data string extraction unit is configured to read the first data string from the storage unit and extract the left-side data string, and the right-side data string extraction unit is configured to read the second data string from the storage unit and extract the right-side data string.

With this configuration, the third data string and the fourth data string, or the fifth data string and the sixth data string are stored in registers having consecutive numbers. It is thereby possible to simplify an instruction code for performing a symmetric filter arithmetic operation and reduce the bit fields of the registers in the instruction code.

Also, it is possible that, for example, the left-side data string extraction unit is configured to read, from the storage unit, the first data string including a third data string and a fourth data string that are consecutive data strings, and extract the left-side data string, and the right-side data string extraction unit is configured to read the first data string from the storage unit as the second data string and extract the right-side data string, such that data positioned at a center of data string that is a center of the third data string is data to be multiplied by a filter coefficient at the center of the bilaterally symmetric filter coefficients.

With this configuration, the left-side data string and the right-side data string are extracted from the first data string including the consecutive third data string and fourth data string, such that the data positioned at the center of the third data string is data to be multiplied by the central filter coefficient. In other words, pairs of data strings that are multiplied by the same filter coefficient can be extracted. Particularly when the number of taps of the symmetric filter arithmetic operation is small, the processing can be simplified because the first data string is stored in a single buffer, and the left-side data string and the right-side data string can be extracted from the single buffer. Accordingly, pairs of data strings corresponding to the number of taps can be easily extracted, and symmetric filter arithmetic operations corresponding to various numbers of taps can be performed by using a processor.

Also, it is possible that, for example, a center between head data of the third data string and tail data of the third data string is set as the center of data string, or a center between the head data of the third data string and head data of the fourth data string is set as the center of data string, the left-side data string extraction unit is configured to extract the left-side data string headed by data on a left side of the center of data string, and the right-side data string extraction unit is configured to extract the right-side data string headed by data that is data on a right side of the center of data string and symmetric to the head data of the left-side data string with respect to the center of data string.

With this configuration, the left-side data string and the right-side data string are extracted such that the center between the head data of the first data string and the tail data of the first data string is set as the center of data string or the center between the head data of the first data string and the head data of the second data string is set as the center of data string, and the head data of the left-side data string and the head data of the right-side data string are bilaterally symmetric with respect to the center of data string. With this configuration, pairs of data strings that are multiplied by the same filter coefficient can be extracted. Accordingly, by extracting pairs of data strings corresponding to the number of taps, symmetric filter arithmetic operations corresponding to various numbers of taps can be performed with a processor.

Also, the present invention can be implemented not only as a symmetric filter arithmetic apparatus described above, but also as a symmetric filter arithmetic method including characteristic processing performed by the processing units of the symmetric filter arithmetic apparatus in the form of steps. The present invention can also be implemented as a program or an integrated circuit that causes a computer to execute the characteristic processing of the symmetric filter arithmetic method. Such a program can be distributed via recording media such as CD-ROM or transmission media such as the Internet. The present invention can also be implemented by any combination of apparatuses, methods, integrated circuits, computer programs, or recording media.

Hereinafter, embodiments of the present invention will be described with reference to the drawings. The embodiments described below are all preferred specific examples of the present invention. The numerical values, shapes, materials, structural elements, the arrangement and connection of the structural elements, steps, the processing order of the steps etc. shown in the following embodiments are mere examples, and therefore do not limit the scope of the claims. Also, among the structural elements in the following embodiments, structural elements not recited in any one of the independent claims are described as arbitrary structural elements constituting more preferred embodiments.

[Embodiment 1]

Figure 1:
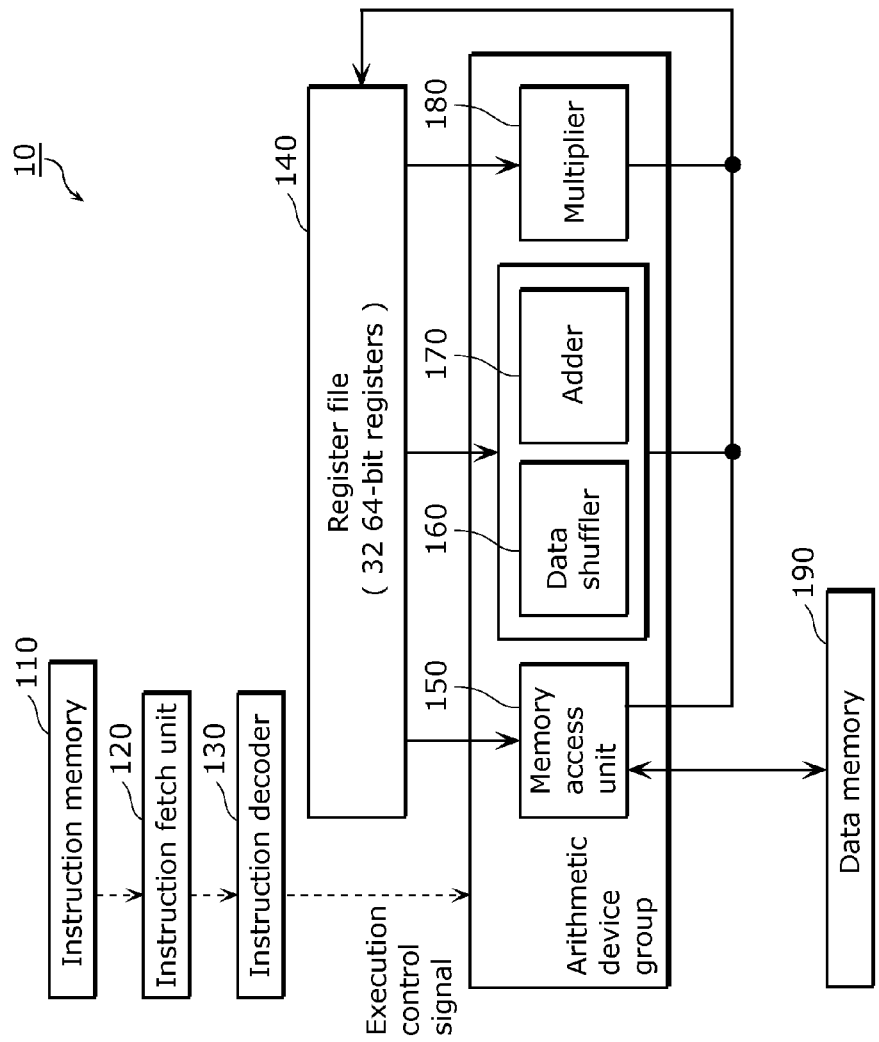
FIG. 1 is a diagram showing a configuration of a filter arithmetic apparatus according to Embodiment 1 of the present invention.

FIG. 1 is a diagram showing a configuration of a symmetric filter arithmetic apparatus 10 (hereinafter referred to as the "filter arithmetic apparatus 10") according to Embodiment 1 of the present invention.

The filter arithmetic apparatus 10 of the present embodiment is an apparatus that performs a filter arithmetic operation on a plurality of pieces of data stored in a storage unit by using bilaterally symmetric filter coefficients, and a feature of the filter arithmetic apparatus 10 is that a data shuffler 160 is provided therein. The following description will be given assuming that the storage unit is a register file, but the storage unit is not limited to a register file. The storage unit may be, for example, a data memory.

As shown in FIG. 1, the filter arithmetic apparatus 10 includes an instruction memory 110, an instruction fetch unit 120, an instruction decoder 130, a register file 140, a memory access unit 150, a data shuffler 160, an adder 170, a multiplier 180, and a data memory 190.

The instruction memory 110 is a memory that stores instructions for instructing operations of the filter arithmetic apparatus 10. The instruction fetch unit 120 acquires an instruction that is to be executed next from the instruction memory 110 and outputs the acquired instruction to the instruction decoder 130.

The instruction decoder 130 analyzes the instruction output by the instruction fetch unit 120, determines an arithmetic device that is to execute the instruction, and outputs an execution control signal to one of the memory access unit 150, the data shuffler 160, the adder 170 and the multiplier 180.

The memory access unit 150 acquires data from the data memory 190 and outputs the data to the register file 140, or acquires data from the register file 140 and outputs the data to the data memory 190, in accordance with the execution control signal from the instruction decoder 130.

The data shuffler 160 acquires data from the register file 140, sorts the data and outputs the result to the adder 170. Specifically, the data shuffler 160 extracts a left-side data string that is to be multiplied by a left-side filter coefficient and a right-side data string that is to be multiplied by a right-side filter coefficient having the same value as the left-side filter coefficient, as a pair of data strings that are to be multiplied by the same filter coefficient.

In this example, it is assumed that the data shuffler 160 performs data sorting in order to perform the symmetric filter arithmetic operation, but the data shuffler 160 may have a function of performing data sorting for a purpose other than the symmetric filter arithmetic operation. A detailed configuration of the data shuffler 160 will be given later.

The adder 170 acquires data from the data shuffler 160, performs an addition operation, and outputs the result to the register file 140. Specifically, the adder 170 calculates an addition data string by adding the left-side data string and the right-side data string extracted by the data shuffler 160. The adder 170 has a function of the "addition unit" recited in the appended claims.

In this example, the data shuffler 160 and the adder 170 are configured as a single processing unit that performs data sorting and addition operations, but it is also possible to use a configuration in which the data shuffler 160 outputs sorted data to the register file 140, and the adder 170 acquires the data from the register file 140 and performs an addition operation.

The multiplier 180 acquires data from the register file 140, performs a multiplication operation and outputs the result to the register file 140. Specifically, the multiplier 180 calculates a multiplication data string by multiplying the addition data string calculated by the adder 170 by the left-side filter coefficient or the right-side filter coefficient. The multiplier 180 has a function of the "multiplication unit" recited in the appended claims.

The register file 140 is a register that holds data that is output by each arithmetic device of the arithmetic device group, and includes 32 registers R0 to R31, each of 64 bits.

The data memory 190 is a memory that stores data required to perform arithmetic operations in the filter arithmetic apparatus 10. The instruction memory 110 and the data memory 190 may be implemented as separate memories, or may be implemented as a single memory.

Figure 2:
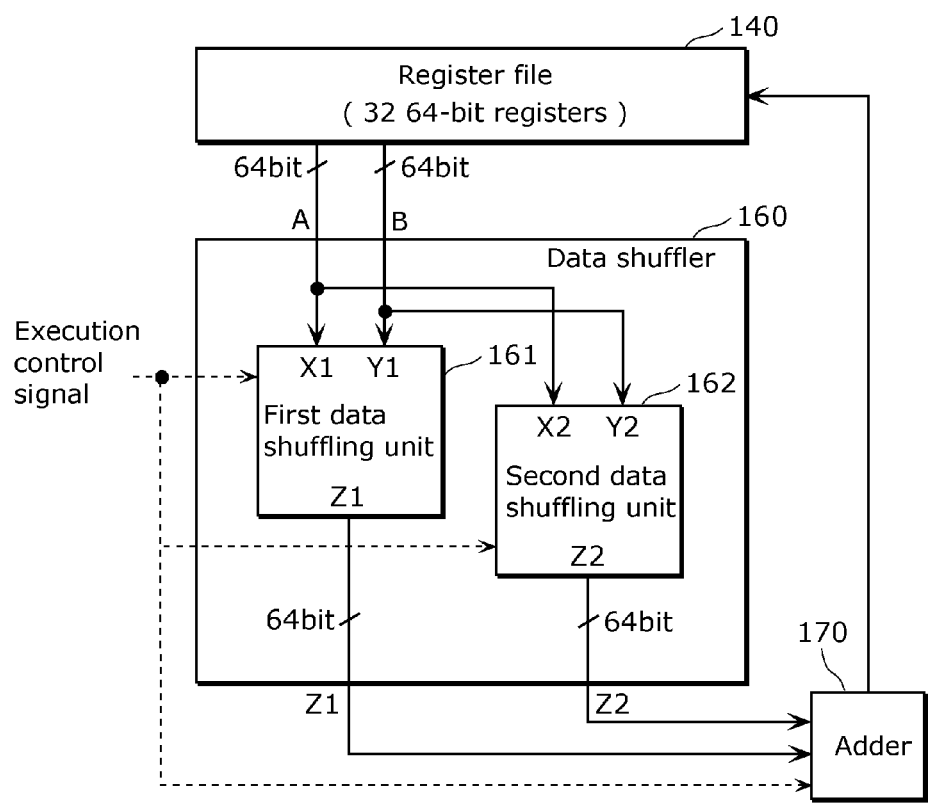
FIG. 2 is a diagram showing a configuration of a data shuffler according to Embodiment 1 of the present invention.

FIG. 2 is a diagram showing a configuration of the data shuffler 160 according to Embodiment 1 of the present invention.

As shown in the diagram, the data shuffler 160 has two 64-bit input ports A and B and two 64-bit output ports Z1 and Z2, and includes a first data shuffling unit 161 and a second data shuffling unit 162. Output data is output from the output ports Z1 and Z2 of the data shuffler 160 to the adder 170, but the output data may be output to the register file 140.

The first data shuffling unit 161 has two 64-bit input ports X1 and Y1 and one 64-bit output port Z1. The second data shuffling unit 162 has two 64-bit input ports X2 and Y2 and one 64-bit output port Z2.

However, the data shuffler 160 has only two 64-bit input ports, and thus is configured such that the data from the input port A of the data shuffler 160 is input to the input port X1 of the first data shuffling unit 161 and to the input port X2 of the second data shuffling unit 162. Likewise, the data from the input port B of the data shuffler 160 is input to the input port Y1 of the first data shuffling unit 161 and to the input port Y2 of the second data shuffling unit 162.

The first data shuffling unit 161 reads two pieces of 64-bit data via the input ports X1 and Y1 and bitwise sorts the data in accordance with the execution control signal. Then, after sorting the data, the first data shuffling unit 161 outputs the 64-bit data that has been sorted via the output port Z1.

Specifically, the first data shuffling unit 161 reads, from the register file 140, a first data string that is a plurality of consecutive pieces of data, and extracts, from the first data string, a left-side data string that is a plurality of consecutive pieces of data that are to be multiplied by a left-side filter coefficient that is a filter coefficient on the left side of the center. More specifically, the first data shuffling unit 161 reads the first data string containing consecutive data strings, namely a third data string and a fourth data string from the register file 140, and extracts the left-side data string.

That is, the first data shuffling unit 161 reads the third data string via the input port X1 and reads the fourth data string via the input port Y1. Then, the first data shuffling unit 161 outputs the left-side data string to the adder 170 via the output port Z1. The processing performed by the first data shuffling unit 161 will be described later in detail. The first data shuffling unit 161 has a function of the "left-side data string extraction unit" recited in the appended claims.

As with the first data shuffling unit 161, the second data shuffling unit 162 reads two pieces of 64-bit data via the input ports X2 and Y2, and bitwise sorts the data in accordance with the execution control signal. Then, after sorting the data, the second data shuffling unit 162 outputs the 64-bit data that has been sorted via the output port Z2.

Specifically, the second data shuffling unit 162 reads, from the register file 140, a second data string that is a plurality of consecutive pieces of data, and extracts, from the second data string, a right-side data string that is a plurality of consecutive pieces of data that are to be multiplied by a right-side filter coefficient that is a filter coefficient on the right side of the center and has the same value as the left-side filter coefficient. More specifically, the second data shuffling unit 162 reads the first data string from the register file 140 as the second data string, and extracts the right-side data string such that the data positioned at a center of data string that is the center of the third data string is data to be multiplied by the filter coefficient at the center of the bilaterally symmetric filter coefficients.

Specifically, the second data shuffling unit 162 reads the third data string via the input port X2, and reads the fourth data string via the input port Y2. Then, the second data shuffling unit 162 outputs the right-side data string to the adder 170 via the output port Z2. The processing performed by the second data shuffling unit 162 will be described later in detail. The second data shuffling unit 162 has a function of the "right-side data string extraction unit" recited in the appended claims.

Next, the operation of the data shuffler 160 will be described. FIGS. 3A to 3C are diagrams illustrating the operation of the data shuffler 160 according to Embodiment 1 of the present invention. Specifically, these diagrams show the operation of the data shuffler 160 in the case of processing 64-bit data in which each element is composed of 8 bits.

FIG. 3A shows data that is input to the data shuffler 160. As shown in the diagram, 64-bit data composed of eight consecutive 8-bit elements, namely, [a0, a1, a2, a3, a4, a5, a6, a7] and [b0, b1, b2, b3, b4, b5, b6, b7] are respectively input to the input ports A and B of the data shuffler 160.

In this case, as shown in FIG. 3B, [a0, a1, a2, a3, a4, a5, a6, a7] is input, as the third data string, to the port X1 of the first data shuffling unit 161 and the port X2 of the second data shuffling unit 162. Likewise, [b0, b1, b2, b3, b4, b5, b6, b7] is input, as the fourth data string, to the port Y1 of the first data shuffling unit 161 and the port Y2 of the second data shuffling unit 162.

Then, upon input of the data, the first data shuffling unit 161 and the second data shuffling unit 162 sort the data in accordance with the execution control signal and output the sorted data. This data sorting is performed in accordance with a table shown in FIG. 3C.

For example, the first data shuffling unit 161 performs data sorting in accordance with the execution control signal indicating "0", and outputs [a0, a1, a2, a3, a4, a5, a6, a7] as the left-side data string. The second data shuffling unit 162 performs data sorting in accordance with the execution control signal indicating "0", and outputs [a7, b0, b1, b2, b3, b4, b5, b6] as the right-side data string.

Here, in the case where the number of taps of the symmetric filter arithmetic operation is an even number, data sorting is performed in accordance with the execution control signals indicating "0" to "3" shown in FIG. 3C, and in the case where the number of taps of the symmetric filter arithmetic operation is an odd number, data sorting is performed in accordance with the execution control signals indicating "4" to "7", the details of which will be given later.

FIG. 4 is a diagram showing mnemonics and an instruction code for operating the data shuffler 160 and the adder 170 according to Embodiment 1 of the present invention.

In the diagram, (a-1) and (a-2) indicate mnemonics for adding a left-side data string and a right-side data string extracted upon input of two input registers Ra and Rb and outputting an output register Rc. In the diagram, (a-3) indicates a mnemonic for adding a left-side data string and a right-side data string extracted upon input of two input registers Ra and Rb and output two output registers Rc and Rc+1.

Specifically, as indicated by (a-1) in the diagram, in valnadd.8, the operands of the instruction mnemonic are the two input registers Ra and Rb, the output register Rc, and an immediate 3-bit value I3 indicating a shuffle pattern of data sorting. Here, the output register Rc is a result obtained by inputting the input registers Ra and Rb, extracting the left-side data string and the right-side data string, and adding the extracted left-side data string and right-side data string in a unit of 8 bits.

In the case where the addition result of the data elements of the left-side data string and the data elements of the right-side data string exceeds 8 bits, saturation processing is performed on the addition result exceeding 8 bits by using valnadd.8s indicated by (a-2) in the diagram, and the result is output as the output register Rc. To be more specific, in the case where the data element is data without an 8-bit code, saturation processing is performed on 255 when the addition result is greater than 255. In the case where the data element is data with an 8-bit code, saturation processing is performed on −128 when the addition result is less than −128, and saturation processing is performed on 127 when the addition result is greater than 127.

Also, with valnadd.8l indicated by (a-3) in the diagram, the addition result of the data elements of the left-side data string and the data elements of the right-side data string is extended to 16 bits, and the result is output as two output registers Rc and Rc+1. The addition result is a 128-bit data string containing eight 16-bit data elements, which requires two output registers.

As indicated by valn.8 indicated by (b) in the diagram, it may be possible to input two input registers Ra and Rb, and output the extracted left-side data string and right-side data string as the output registers Rc and Rc+1. Here, the operands of the instruction mnemonic are the two input registers Ra and Rb, the two output registers Rc and Rc+1, and an immediate 3-bit value I3 indicating a shuffle pattern of data sorting.

The bit width of the elements constituting the 64-bit data is represented by the opcode, and the element width of the instruction of this example is 8 bits. The execution control signal that is output to the data shuffler 160 of the shuffle arithmetic device of this example is a value of the shuffle pattern.

The instruction code of this example is composed of 32 bits, and includes an opcode field indicating an operation of the data snuffler 160, a shuffle pattern field, an element width field, and fields of the register numbers Ra, Rb and Rc.

The opcode field has a bit width of 12 bits, the shuffle pattern field has a bit width of 3 bits, the element width field has a bit width of 2 bits, and the fields of the register numbers Ra, Rb and Rc each have a bit width of 5 bits. With respect to the correspondence to the element width, 0b00 is 8 bits, 0b01 is 16 bits, and 0b10 is 32 bits. Here, in (a-3) and (b) of the diagram, there are two output registers. In order to reduce the register bit fields in the instruction code, a restriction is imposed that the register numbers of two output registers be consecutive numbers such as Rc and Rc+1.

In the present embodiment, the restriction that the register numbers of two output registers be consecutive numbers is imposed, but the restriction may be that the register numbers of two input registers be consecutive numbers. Also, the restriction that the register numbers of two output registers be consecutive numbers is not a requirement, and thus the restriction that the register numbers of two output registers be consecutive numbers may be removed by further adding a register number field to the instruction code.

Next, processing performed by the filter arithmetic apparatus 10 to perform a symmetric filter arithmetic operation by using the valnadd.8 instruction shown in FIG. 4 will be described with reference to FIGS. 5 to 9. Note that the valn.8 instruction can also be used, and there may be a need for using the valnadd.8s or valnadd.8l instruction, but the following description will be given by using, as an example, the valnadd.8 instruction.

Figure 5:
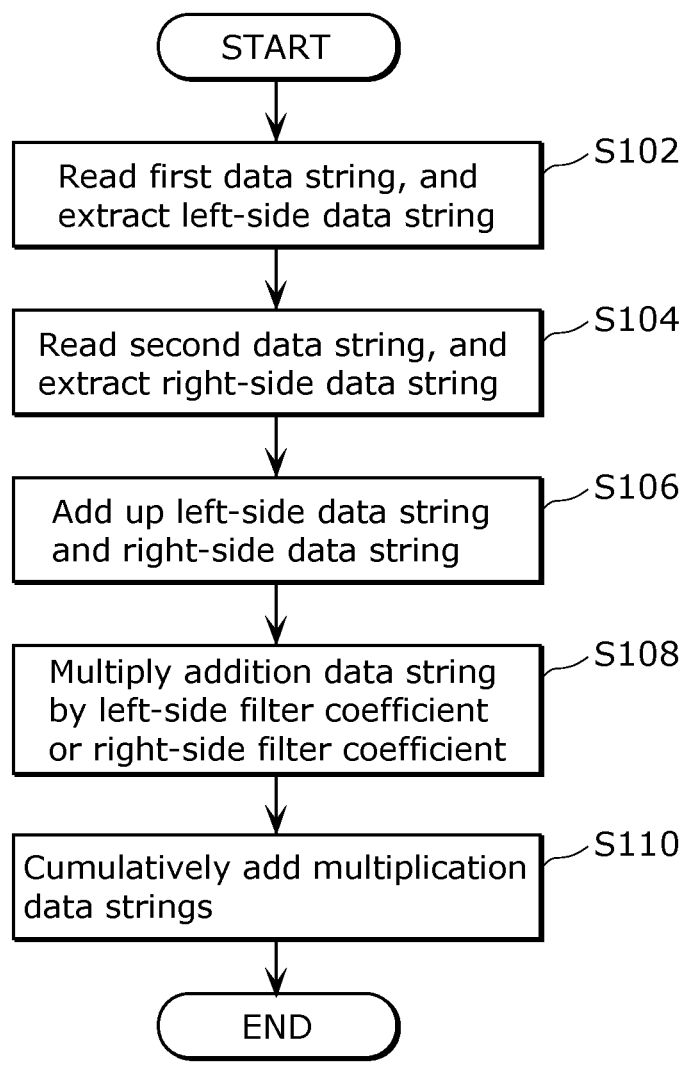
FIG. 5 is a flowchart illustrating an example of a symmetric filter arithmetic operation performed by the filter arithmetic apparatus according to Embodiment 1 of the present invention.
Figure 7:
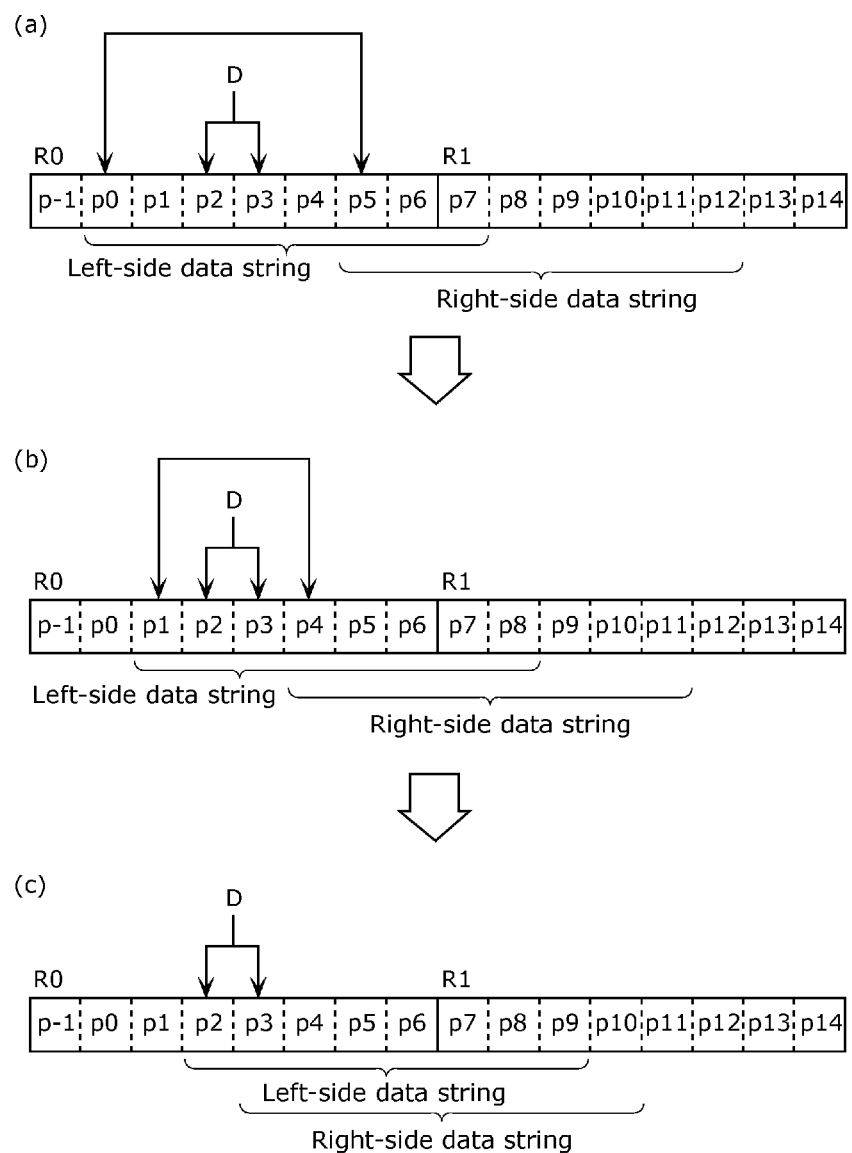
FIG. 7 is a diagram illustrating a symmetric filter arithmetic operation performed by the filter arithmetic apparatus according to Embodiment 1 of the present invention.

FIG. 5 is a flowchart showing an example of a symmetric filter arithmetic operation performed by the filter arithmetic apparatus 10 according to Embodiment 1 of the present invention. FIG. 6 is a diagram showing instructions for the filter arithmetic apparatus 10 to perform symmetric filter arithmetic operations according to Embodiment 1 of the present invention. FIGS. 7 to 93 are diagrams illustrating symmetric filter arithmetic operations performed by the filter arithmetic apparatus 10 according to Embodiment 1 of the present invention.

Here, it is assumed that the filter arithmetic apparatus 10 performs a symmetric filter arithmetic operation on eight pixels [p0, p1, p2, p3, p4, p5, p6, p7] shown in FIG. 20. The column "Number of filter taps" shown in FIG. 6 indicates the number of filter taps on which the symmetric filter arithmetic operation is performed. The column "Input data of R0 and R1" indicates pixel data that needs to be input to the registers R0 and R1 before the valnadd.8 instruction is executed. In FIG. 6, as the pixel data, there are data such as p-1, p-2, and p-3, the data p-1 indicating a pixel adjacent to the left of the pixel p0, the data p-2 indicating a pixel adjacent to the left of the pixel p-1, and the data p-3 indicating a pixel adjacent to the left of the pixel p-2. The column "Instruction" indicates a valnadd.8 instruction for generating a pair of data strings that use the same filter coefficient in the symmetric filter arithmetic operation and adding the paired data strings.

As an example, a case will be described in which the filter arithmetic apparatus 10 performs a symmetric 6-tap filter arithmetic operation corresponding to the eight pixels p0 to p7 shown in FIG. 20 so as to obtain filter arithmetic operation results q0 to q7. First, a load instruction is issued to store [p-1, p0, p1, p2, p3, p4, p5, p6] in the register R0, and [p7, p8, p9, p10, p11, p12, p13, p14] in the register R1.

Then, as shown in FIG. 5, the first data shuffling unit 161 reads, from the register file 140, a first data string composed of consecutive data strings, namely a third data string and a fourth data string, and extracts a left-side data string (S102).

Specifically, "valnadd.8 R2, R0, R1, 1" that is an instruction in the case where the number of filter taps shown in FIG. 6 is "6" is issued. In this case, the first data shuffling unit 161 reads the first data string composed of [p-1, p0, p1, p2, p3, p4, p5, p6] of the register R0 as the third data string and [p7, p8, p9, p10, p11, p12, p13, p14] of the register R1 as the fourth data string. Then, the first data shuffling unit 161 extracts [p0, p1, p2, p3, p4, p5, p6, p7] that is the data output shown in FIG. 3C in the case where the execution control signal indicates "1", as the left-side data string.

Also, the second data shuffling unit 162 reads the first data string from the register file 140 as a second data string, and extracts a right-side data string such that the data at the center of data string of the third data string is data to be multiplied by the filter coefficient at the center of the bilaterally symmetric filter coefficients (S104).

Specifically, because "valnadd.8 R2, R0, R1, 1" instruction has been issued, the second data shuffling unit 162 reads the first data string composed of [p-1, p0, p1, p2, p3, p4, p5, p6] of the register R0 as the third data string and [p7, p8, p9, p10, p11, p12, p13, p14] of the register R1 as the fourth data string, as the second data string. Then, the second data shuffling unit 162 extracts [p5, p6, p7, p8, p9, p10, p11, p12] that is the data output shown in FIG. 3C in the case where the execution control signal indicates "1", as the right-side data string.

In other words, as shown in (a) of FIG. 7, the second data shuffling unit 162 extracts the right-side data string such that data "p2, p3" at a data string center D that is the center of the third data string [p-1, p0, p1, p2, p3, p4, p5, p6] are/is data to be multiplied by the filter coefficient at the center of the bilaterally symmetric filter coefficients.

Specifically, in the case where the number of taps of the symmetric filter arithmetic operation is an even number, "p2, p3" that is the center between the head data "p-1" of the third data string and the tail data "p6" of the third data string is set as the data string center D. Then, the first data shuffling unit 161 extracts the left-side data string [p0, p1, p2, p3, p4, p5, p6, p7] headed by data positioned on the left side of the data string center D (p2, p3). Then, the second data shuffling unit 162 extracts the right-side data string [p5, p6, p7, p8, p9, p10, p11, p12] headed by data "p5", which is the data positioned on the right side of the data string center D (p2, p3) and symmetric to the head data "p0" of the left-side data string with respect to the data string center D.

In this way, [p0, p1, p2, p3, p4, p5, p6, p7] and [p5, p6, p7, p8, p9, p10, p11, p12] that are pixel data to be multiplied by the filter coefficient k0 are extracted.

Finally, the two pieces of pixel data are added up to calculate [p0+p5, p1+p6, p2+p7, p3+p8, p4+p9, p5+p10, p6+p11, p7+p12] that is stored in the register R2 (S106). This completes the operation according to the "valnadd.8 R2, R0, R1, 1" instruction.

Then, "valnadd.8 R3, R0, R1, 2" that is the next instruction in the case where the number of filter taps shown in FIG. 6 is "6" is issued. In this case, as in the case of the "valnadd.8 R2, R0, R1, 1" instruction, the first data shuffling unit 161 extracts [p1, p2, p3, p4, p5, p6, p7, p8] that is the data output shown in FIG. 3C in the case where the execution control signal indicates "2", as the left-side data string. Also, the second data shuffling unit 162 extracts [p4, p5, p6, p7, p8, p9, p10, p11], as the right-side data string.

In other words, as shown in (b) of FIG. 7, the first data shuffling unit 161 extracts the left-side data string [p1, p2, p3, p4, p5, p6, p7, p8] headed by data positioned on the left side of the data string center D (p2, p3). Then, the second data shuffling unit 162 extracts the right-side data string [p4, p5, p6, p7, p8, p9, p10, p11] headed by data "p4", which is the data positioned on the right side of the data string center D (p2, p3) and symmetric to the head data "p1" of the left-side data string with respect to the data string center D.

In this way, [p1, p2, p3, p4, p5, p6, p7, p8] and [p4, p5, p6, p7, p8, p9, p10, p11] that are pixel data to be multiplied by the filter coefficient k1 are extracted.

Finally, the two pieces of pixel data are added up to calculate [p1+p4, p2+p5, p3+p6, p4+p7, p5+p8, p6+p9, p7+p10, p8+p11] that is stored in the register R3 (S106). This completes the operation according to the "valnadd,8 R3, R0, R1, 2" instruction.

Finally, "valnadd.8 R4, R0, R1, 3" that is the next instruction in the case where the number of filter taps shown in FIG. 6 is "6" is issued. In this case as well, as in the case of the other instructions, the first data shuffling unit 161 extracts [p2, p3, p4, p5, p6, p7, p8, p9] that is the data output shown in FIG. 3C in the case where the execution control signal indicates "3", as the left-side data string. Also, the second data shuffling unit 162 extracts [p3, p4, p5, p6, p7, p8, p9, p10], as the right-side data string.

In other words, as shown in (c) of FIG. 7, the first data shuffling unit 161 extracts the left-side data string [p2, p3, p4, p5, p6, p7, p8, p9] headed by data positioned on the left side of the data string center D, and the second data shuffling unit 162 extracts the right-side data string [p3, p4, p5, p6, p7, p8, p9, p10] headed by data "p3" that is symmetric to the head data "p2" of the left-side data string with respect to the data string center D.

In this way, [p2, p3, p4, p5, p6, p7, p8, p9] and [p3, p4, p5, p6, p7, p8, p9, p10] that are pixel data to be multiplied by the filter coefficient k2 are extracted.

Finally, the two pieces of pixel data are added up to calculate [p2+p3, p3+p4, p4+p5, p5+p6, p6+p7, p7+p8, p8+p9, p9+p10] that is stored in the register R4 (S106). This completes the operation according to the "valnadd.8 R4, R0, R1, 3" instruction. Through this, the extraction and addition of pairs of pixel data that use the same filter coefficient in the symmetric filter arithmetic operation end.

Referring back to FIG. 5, next, the multiplier 180 multiplies the addition data string calculated by the adder 170 by the left-side filter coefficient or the right-side filter coefficient to calculate a multiplication data string (S108). Since the left-side filter coefficient and the right-side filter coefficient are the same value, the multiplier 180 can calculate the same multiplication data string by multiplying the addition data string by the left-side filter coefficient or multiplying the addition data string by the right-side filter coefficient.

Specifically, as shown in FIG. 8, the multiplier 180 multiplies an addition data string R2 by the filter coefficient k0, multiplies an addition data string R3 by the filter coefficient k1, and multiplies an addition data string R4 by the filter coefficient k2.

Then, referring back to FIG. 5, the filter arithmetic apparatus 10 cumulatively adds the multiplication data strings calculated by the multiplier 180 and outputs the symmetric filter arithmetic operation result (S110). Specifically, as shown in FIG. 8, the filter arithmetic apparatus can obtain a filter arithmetic operation result [q0, q1, q2, q3, q4, q5, q6, q7] by cumulatively adding the three multiplication results calculated by the multiplier 180.

Figure 9A:
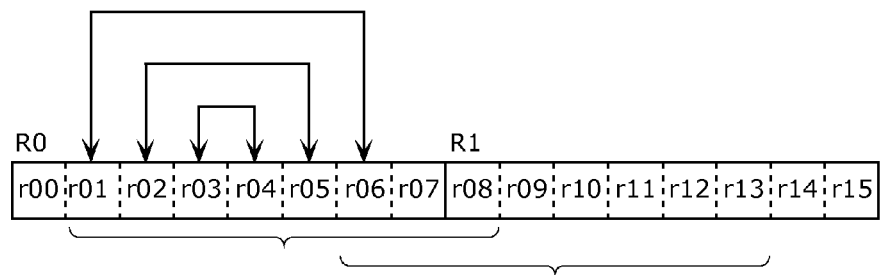
FIG. 9A is a diagram illustrating a symmetric filter arithmetic operation performed by the filter arithmetic apparatus according to Embodiment 1 of the present invention.

In this way, as shown in FIG. 9A, when the content of the register R0 is represented by [r00, r01, r02, r03, r04, r05, r06, r07], for example, by loading the data such that pixels are stored so that the pixels at the positions that are symmetric with respect to the center of symmetry of the filter coefficients in the case where a filter arithmetic operation result of q0 is determined are r03 and r04, it is possible to perform symmetric filter arithmetic operations having an even number of taps up to 8 taps.

Figure 9B:
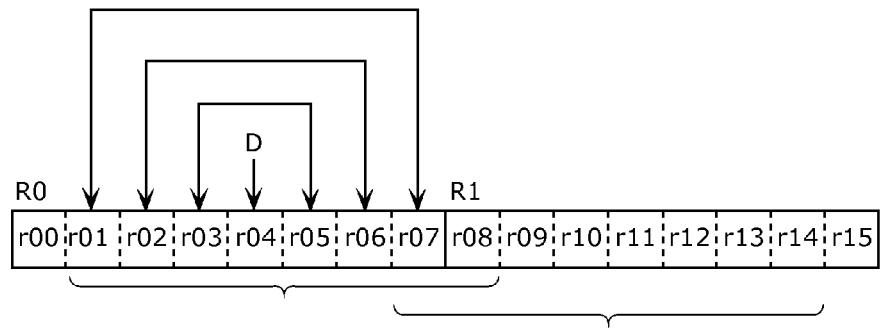
FIG. 9B is a diagram illustrating a symmetric filter arithmetic operation performed by the filter arithmetic apparatus according to Embodiment 1 of the present invention.

Also, in the case of a symmetric filter having an odd number of taps, as shown in FIG. 9B, the data can be loaded such that pixels are stored so that, for example, the pixel at the position of the center of symmetry of the filter coefficients in the case where a filter arithmetic operation result of q0 is determined is r04 (the data string center D shown in the diagram). In other words, in the case where the number of taps of the filter arithmetic operation is an odd number, the center between the head data "r00" of the third data string and the head data "r08" of the fourth data string is set as the data string center D. In the case where the number of taps is an odd number, it is possible to perform symmetric filter arithmetic operations having up to 9 taps by using the valnadd.8 instruction.

As discussed above, according to the filter arithmetic apparatus 10 of Embodiment 1, the left-side data string is extracted from the first data string stored in the register file 140, and the right-side data string is extracted from the second data string stored in the register file 140. In other words, pairs of data strings that are multiplied by the same filter coefficient can be extracted. Accordingly, by extracting pairs of data strings corresponding to the number of taps, symmetric filter arithmetic operations corresponding to various numbers of taps can be performed with a processor.

Also, the left-side data string and the right-side data string are added up and then multiplied by the left-side filter coefficient or the right-side filter coefficient. In other words, pairs of data strings that are multiplied by the same filter coefficient are added up and then multiplied by the filter coefficient. Accordingly, by performing addition and multiplication according to the number of taps, symmetric filter arithmetic operations corresponding to various numbers of taps can be performed with a processor.

Also, the left-side data string and the right-side data string are extracted from the first data string including the consecutive third data string and fourth data string, such that the data positioned at the center of the third data string is data to be multiplied by the central filter coefficient. In other words, pairs of data strings that are multiplied by the same filter coefficient can be extracted. Particularly when the number of taps of the symmetric filter arithmetic operation is small, the processing can be simplified because the first data string is stored in a single buffer, and the left-side data string and the right-side data string can be extracted from the single buffer. Accordingly, pairs of data strings corresponding to the number of taps can be easily extracted, and symmetric filter arithmetic operations corresponding to various numbers of taps can be performed by using a processor.

Also, the left-side data string and the right-side data string are extracted such that in the case where the number of taps of the filter arithmetic operation is an even number, the center between the head data of the first data string and the tail data of the first data string is set as the center of data string, or in the case where the number of taps of the filter arithmetic operation is an odd number, the center between the head data of the first data string and the head data of the second data string is set as the center of data string, and the head data of the left-side data string and the head data of the right-side data string are bilaterally symmetric with respect to the center of data string. With this configuration, pairs of data strings that are multiplied by the same filter coefficient can be extracted. Accordingly, by extracting pairs of data strings corresponding to the number of taps, symmetric filter arithmetic operations corresponding to various numbers of taps can be performed with a processor.

[Embodiment 2]

FIG. 10 is a diagram showing a configuration of a symmetric filter arithmetic apparatus 11 (hereinafter referred to as the "filter arithmetic apparatus 11") according to Embodiment 2 of the present invention. A feature of the filter arithmetic apparatus 11 of the present embodiment is that a data shuffler 200 is provided in place of the data shuffler 160 of the filter arithmetic apparatus 10 of Embodiment 1.

As shown in the diagram, the filter arithmetic apparatus 11 includes an instruction memory 110, an instruction fetch unit 120, an instruction decoder 130, a register file 140, a memory access unit 150, a data shuffler 200, an adder 170, a multiplier 180, and a data memory 190.

In the diagram, constituent elements that are the same as those of the filter arithmetic apparatus 10 of Embodiment 1 shown in FIG. 1 are given the same reference numerals, and a description thereof is omitted.

As with the data shuffler 160 of the filter arithmetic apparatus 10 of Embodiment 1, the data shuffler 200 acquires data from the register file 140, sorts the data, and outputs the result to the adder 170.

As in Embodiment 1, the data shuffler 200 and the adder 170 are configured as a single processing unit that performs data sorting and addition operations, but it is also possible to use a configuration in which the data shuffler 200 outputs sorted data to the register file 140, and the adder 170 acquires the data from the register file 140 and performs an addition operation.

Also, the data shuffler 200 may have a function of data sorting for a purpose other than the filter arithmetic operation. A specific difference between the data shuffler 200 and the data shuffler 160 will be described below.

Figures 11, 12:
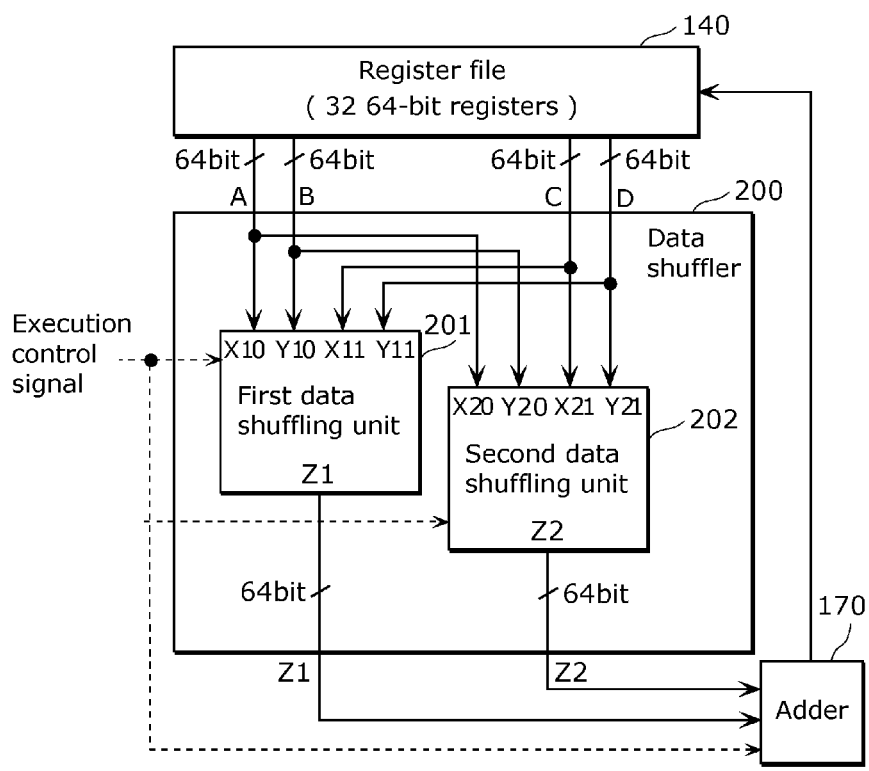
FIG. 11 is a diagram showing a configuration of a data shuffler according to Embodiment 2 of the present invention.
FIG. 12 is a diagram illustrating an operation of the data shuffler according to Embodiment 2 of the present invention.

FIG. 11 is a diagram showing a configuration of the data shuffler 200.

As shown in the diagram, the data shuffler has four 64-bit input ports A, B, C and D, two 64-bit output ports Z1 and Z2, and includes a first data shuffling unit 201 and a second data shuffling unit 202. The data shuffler 200 may be configured to have a single 128-bit input port by combining the input ports A and B and a single 128-bit input port by combining the input ports C and D.

The first data shuffling unit 201 has four 64-bit input ports X10, Y10, X11 and Y11, and a single 64-bit output port Z1. The second data shuffling unit 202 has four 64-bit input ports X20, Y20, X21 and Y21, and a single 64-bit output port Z2. As in Embodiment 1, output data is output from the output ports Z1 and Z2 of the data shuffler 200 to the adder 170, but the output data may be output to the register file 140.

The input port X10 of the first data shuffling unit 201 is configured to receive input of data from the input port A of the data shuffler 200, and the input port Y10 of the first data shuffling unit 201 is configured to receive input of data from the input port B of the data shuffler 200. Likewise, the input port X11 of the first data shuffling unit 201 is configured to receive input of data from the input port C of the data shuffler 200, and the input port Y11 is configured to receive input of data from the input port D. The first data shuffling unit 201 may be configured to have a single input port by combining the input ports X10 and Y10 and a single input port by combining the input ports X11 and Y11.

Also, the input port X20 of the second data shuffling unit 202 is configured to receive input of data from the input port A of the data shuffler 200, and the input port Y20 of the second data shuffling unit 202 is configured to receive input of data from the input port B of the data shuffler 200. Likewise, the input port X21 of the second data shuffling unit 202 is configured to receive input of data from the input port C of the data shuffler 200, and the input port Y21 is configured to receive input of data from the input port D. The second data shuffling unit 202 may be configured to have a single input port by combining the input ports X20 and Y20 and a single input port by combining the input ports X21 and Y21.

The first data shuffling unit 201 reads four pieces of 64-bit data via the input ports X10, Y10, X11 and Y11, and bitwise sorts the data in accordance with the execution control signal. Then, after sorting the data, the first data shuffling unit 201 outputs the 64-bit data that has been sorted via the output port Z1.

Specifically, the first data shuffling unit 201 reads, from the register file 140, a first data string that is a plurality of consecutive pieces of data, and extracts, from the first data string, a left-side data string that is a plurality of consecutive pieces of data that are to be multiplied by a left-side filter coefficient that is the filter coefficient on the left side. More specifically, the first data shuffling unit 201 reads the first data string containing consecutive data strings, namely a third data string and a fourth data string from the register file 140, and extracts the left-side data string.

That is, the first data shuffling unit 201 reads the third data string via the input port X10, and reads the fourth data string via the input port Y10. Then, the first data shuffling unit 201 outputs the left-side data string to the adder 170 via the output port Z1. Here, the first data shuffling unit 201 extracts the left-side data string by setting the center of data string also using the second data string read via the input ports X11 and Y11. The processing performed by the first data shuffling unit 201 will be described later in detail. The first data shuffling unit 201 has a function of the "left-side data string extraction unit" recited in the appended claims.

As with the first data shuffling unit 201, the second data shuffling unit 202 reads four pieces of 64-bit data via the input ports X20, Y20, X21 and Y21, and bitwise sorts the data in accordance with the execution control signal. Then, after sorting the data, the second data shuffling unit 202 outputs the 64-bit data that has been sorted via the output port Z2.

Specifically, the second data shuffling unit 202 reads, from the register file 140, a second data string that is a plurality of consecutive pieces of data, and extracts, from the second data string, a right-side data string that is a plurality of consecutive pieces of data that are multiplied by a right-side filter coefficient that is the filter coefficient on the right side of the center and has the same value as the left-side filter coefficient. More specifically, the second data shuffling unit 202 reads the second data string containing consecutive data strings, namely a fifth data string and a sixth data string from the register file 140 and extracts the right-side data string such that the data positioned at the center of data string that is the center between the head data of the third data string and the head data of the sixth data string are data to be multiplied by the central filter coefficient of the bilaterally symmetric filter coefficients.

That is, the second data shuffling unit 202 reads the fifth data string via the input port X21, and reads the sixth data string via the input port Y21. Then, the second data shuffling unit 202 outputs the right-side data string to the adder 170 via the output port Z2. Here, the second data shuffling unit 202 extracts the right-side data string by setting the center of data string also using the first data string read via the input ports X20 and Y20. The processing performed by the second data shuffling unit 202 will be described later in detail. The second data shuffling unit 202 has a function of the "right-side data string extraction unit" recited in the appended claims.

Next, the operation of the data shuffler 200 will be described. Unlike the data shuffler 160 of Embodiment 1, with the data shuffler 200 of the present embodiment, the number of registers read from the register file 140 is changed according to the execution control signal. The data shuffler 200 reads two 64-bit registers in the case where the execution control signal indicates 0 to 7, and reads four 64-bit registers in the case where the execution control signal indicates 8 to 15, from the register file 140.

FIGS. 12 to 14B are diagrams illustrating the operations of the data shuffler 200 according to Embodiment 2 of the present invention. First, FIG. 12 shows data input to the data shuffler 200 in the case where the execution control signal indicates 0 to 7.

As shown in FIG. 12, in the case where the execution control signal indicates 0 to 7, a single piece of 64-bit register data [a0, a1, a2, a3, a4, a5, a6, a7] is input to the port A, and another single piece of 64-bit register data [b0, b1, b2, b3, b4, b5, b6, b7] is input to the port B. No data is input to the port C and the port D.

In this case, as shown in FIG. 3B, as with the data shuffler 160 of Embodiment 1, [a0, a1, a2, a3, a4, a5, a6, a7] is input to the port X10 of the first data shuffling unit 201 and the port X20 of the second data shuffling unit 202. Also, [b0, b1, b2, b3, b4, b5, b6, b7] is input to the port Y10 of the first data shuffling unit 201 and the port Y20 of the second data shuffling unit 202.

Upon input of the data, the first data shuffling unit 161 and the second data shuffling unit 162 sort the data in accordance with the execution control signal. This data sorting is performed in accordance with the table shown in FIG. 3C, as with the data shuffler 160 of Embodiment 1.

Next, the operation in the case where the execution control signal indicates 8 to 15 will be described. FIG. 13A shows data input to the data shuffler 200 in the case where the execution control signal indicates 8 to 15.

As shown in the diagram, in the case where the execution control signal indicates 8 to 15, a single piece of 64-bit register data [a0, a1, a2, a3, a4, a5, a6, a7] is input to the port A and another single piece of 64-bit register data [b0, b1, b2, b3, b4, b5, b6, b7] is input to the port B. Furthermore, another single piece of 64-bit register data [c0, c1, c2, c3, c4, c5, c6, c7] is input to the port C, and another single piece of 64-bit register data [d0, d1, d2, d3, d4, d5, d6, d7] is input to the port D.

In this case, as shown in FIG. 13B, [a0, a1, a2, a3, a4, a5, a6, a7] is input to the port X10 of the first data shuffling unit 201, and [b0, b1, b2, b3, b4, b5, b6, b7] is input to the port Y10 of the first data shuffling unit 201. Also, [c0, c1, c2, c3, c4, c5, c6, c7] is input to the port X11 of the first data shuffling unit 201, and [d0, d1, d2, d3, d4, d5, d6, d7] is input to the port Y11 of the first data shuffling unit 201.

Also, [a0, a1, a2, a3, a4, a5, a6, a7] is input to the port X20 of the second data shuffling unit 202, and [b0, b1, b2, b3, b4, b5, b6, b7] is input to the port Y20 of the second data shuffling unit 202. Also, [c0, c1, c2, c3, c4, c5, c6, c7] is input to the port X21 of the second data shuffling unit 202, and [d0, d1, d2, d3, d4, d5, d6, d7] is input to the port Y21 of the second data shuffling unit 202.

Then, upon input of the data, the first data shuffling unit 201 and the second data shuffling unit 202 sort the data in accordance with the execution control signal. This data sorting is performed in accordance with the table shown in FIG. 13C.

Figure 14A:
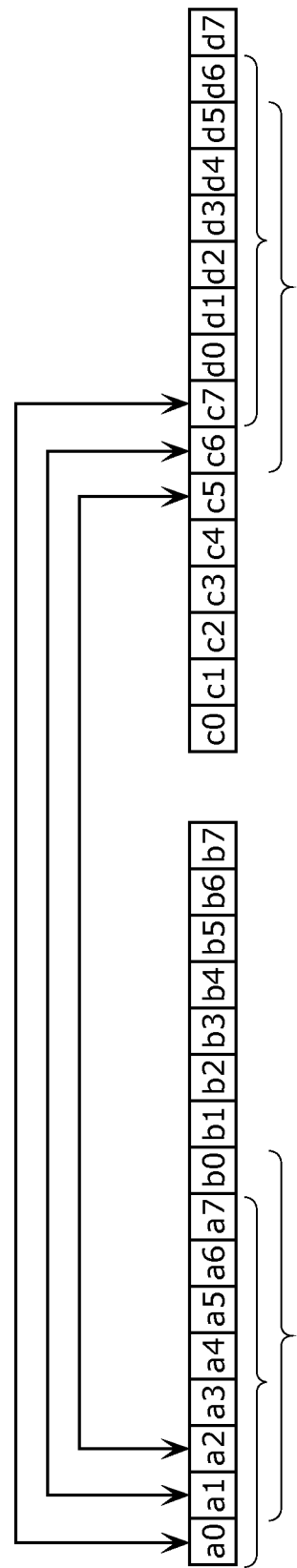
FIG. 14A is a diagram illustrating an operation of the data shuffler according to Embodiment 2 of the present invention.

Specifically, in the case where the number of taps of the symmetric filter arithmetic operation is an even number, as shown in FIG. 14A, the first data shuffling unit 201 sorts the data in accordance with, for example, the execution control signal indicating "8", and outputs [a0, a1, a2, a3, a4, a5, a6, a7] as the left-side data string. Also, the second data shuffling unit 202 sorts the data in accordance with the execution control signal indicating "8", and outputs [c7, d0, d1, d2, d3, d4, d5, d6] as the right-side data string. Also, the first data shuffling unit 201 sorts the data in accordance with the execution control signal indicating "9", and outputs [a1, a2, a3, a4, a5, a6, a7, b0] as the left-side data string. Also, the second data shuffling unit 202 sorts the data in accordance with the execution control signal indicating "8", and outputs [c6, c7, d0, d1, d2, d3, d4, d5] as the right-side data string.

Figure 14B:
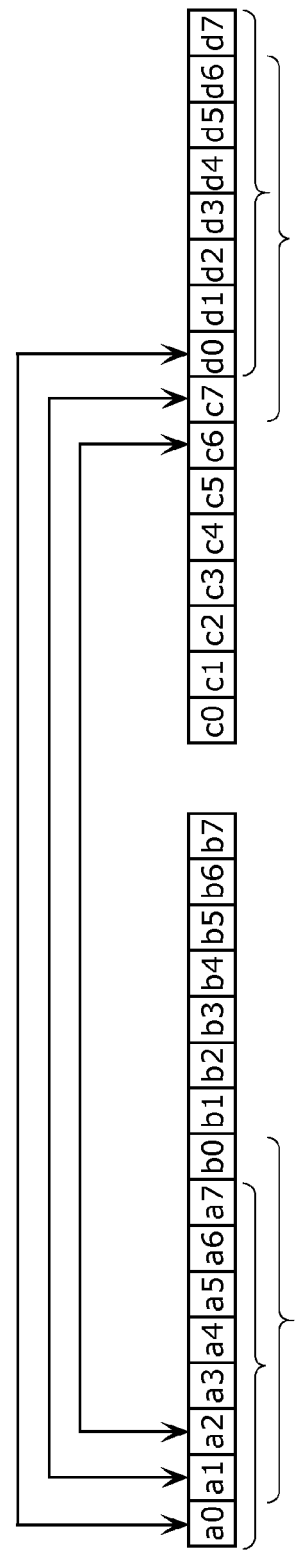
FIG. 14B is a diagram illustrating an operation of the data shuffler according to Embodiment 2 of the present invention.

Also, in the case where the number of taps of the symmetric filter arithmetic operation is an odd number, as shown in FIG. 14B, the first data shuffling unit 201 sorts the data in accordance with, for example, the execution control signal indicating "16", and outputs [a0, a1, a2, a3, a4, a5, a6, a7] as the left-side data string. Also, the second data shuffling unit 202 sorts the data in accordance with the execution control signal indicating "16", and outputs [d0, d1, d2, d3, d4, d5, d6, d7] as the right-side data string. Also, the first data shuffling unit 201 sorts the data in accordance with the execution control signal indicating "17", and outputs [a1, a2, a3, a4, a5, a6, a7, b0] as the left-side data string. Also, the second data shuffling unit 202 sorts the data in accordance with the execution control signal indicating "16", and outputs [c7, d0, d1, d2, d3, d4, d5, d6] as the right-side data string.

In this way, in the case where the number of taps of the symmetric filter arithmetic operation is an even number, data sorting is performed in accordance with the execution control signal indicating "8" to "15" shown in FIG. 13C, and in the case where the number of taps of the symmetric filter arithmetic operation is an odd number, data sorting is performed in accordance with the execution control signal indicating "16" to "23".

FIG. 15 is a diagram showing mnemonics and an instruction code for operating the data shuffler 200 and the adder 170 according to Embodiment 2 of the present invention. The instruction mnemonics and the instruction code shown in FIG. 15 causes the data shuffler 200 and the adder 170 to operate in the same manner as with the data shuffler 160 and the adder 170 of Embodiment 1, and the operation is the same as that performed by the data shuffler 160 and the adder 170 of Embodiment 1, and thus a description thereof is omitted here.

In FIG. 15, (a-1) and (a-2) indicate mnemonics for adding a left-side data string and a right-side data string extracted upon input of four input registers Ra, Ra+1, Rb and Rb+1 and outputting an output register Rc. In the diagram, (a-3) indicates a mnemonic for adding a left-side data string and a right-side data string extracted upon input of four input registers Ra, Ra+1, Rb and Rb+1 and outputting two output registers Rc and Rc+1.

Specifically, as indicated by (a-1) in the diagram, in valnpadd.8, the operands of the instruction mnemonic are the two four input registers Ra, Ra+1, Rb and Rb+1, the output register Rc, and an immediate 3-bit value I3 indicating a shuffle pattern of data sorting. Here, the output register Rc is a result obtained by inputting the input registers Ra, Ra+1, Rb and Rb+1, extracting the left-side data string and the right-side data string, and adding the extracted left-side data string and right-side data string in a unit of 8 bits.

In the case where the addition result of the data elements of the left-side data string and the data elements of the right-side data string exceeds 8 bits, saturation processing is performed on the addition result exceeding 8 bits by using valnpadd.8s indicated by (a-2) in the diagram, and the result is output as the output register Rc. To be more specific, in the case where the data element is data without an 8-bit code, saturation processing is performed on 255 when the addition result is greater than 255. In the case where the data element is data with an 8-bit code, saturation processing is performed on −128 when the addition result is less than −128, and saturation processing is performed on 127 when the addition result is greater than 127.

Also, with valnpadd.8l indicated by (a-3) in the diagram, the addition result of the data elements of the left-side data string and the data elements of the right-side data string is extended to 16 bits, and the result is output as the output registers Rc and Rc+1. The addition result is a 128-bit data string containing eight 16-bit data elements, which requires two output registers.

As indicated by valnp.8 indicated by (b) in the diagram, it may be possible to input four input registers Ra, Ra+1, Rb and Rb+1, and output the extracted left-side data string and right-side data string as the output registers Rc and Rc+1. Here, the operands of the instruction mnemonic are the four input registers Ra, Ra+1 and Rb, Rb+1, the two output registers Rc and Rc+1, and an immediate 3-bit value I3 indicating a shuffle pattern of data sorting.

In order to reduce the register bit fields in the instruction code, a restriction is imposed that the register numbers of two out of the four input registers be consecutive numbers such as Rc and Rc+1. Specifically, the third data string and the fourth data string, or the fifth data string and the sixth data string are stored in registers of consecutive numbers.

The bit width of the elements constituting the 64-bit data is represented by the opcode, and the element width of the instruction of this example is 8 bits. The execution control signal that is output to the data shuffler 200 of the shuffle arithmetic device of this example is a value obtained by adding 8 to the value of the shuffle pattern.

The instruction code shown in the diagram is composed of 32 bits, and includes an opcode field indicating an operation of the data shuffler 200, a shuffle pattern field, an element width field, and fields of the register numbers Ra, Rb and Rc.

The opcode field has a bit width of 11 bits, the shuffle pattern field has a bit width of 4 bits, the element width field has a bit width of 2 bits, and the fields of the register numbers Ra, Rb and Rc each have a bit width of 5 bits. Here, with respect to the correspondence to the element width, 0b00 is 8 bits, 0b01 is 16 bits, and 0b10 is 32 bits.

In the present embodiment, the restriction that the register numbers of the registers be consecutive numbers is not a requirement, and thus the restriction that the register numbers of the registers be consecutive numbers may be removed.

Next, processing performed by the filter arithmetic apparatus 11 to perform a symmetric filter arithmetic operation by using the valnadd.8 instruction shown in FIG. 4 and the valnpadd.8 instruction shown in FIG. 15 will be described with reference to FIGS. 16 and 17. Note that the valnp.8 instruction can also be used, and there may be a need for using the valnpadd.8s or valnpadd.8l instruction, but the following description will be given by using, as an example, the valnpadd.8 instruction. In the case where the valnadd.8 instruction is used, as shown in FIG. 6, the same processing as the filter arithmetic apparatus 10 of Embodiment 1 is performed, and thus a description thereof is omitted here.

FIGS. 16 to 19 are diagrams illustrating symmetric filter arithmetic operations performed by the filter arithmetic apparatus 11 according to Embodiment 2 of the present invention.

Here, the valnpadd.8 instruction is used in the case of a symmetric filter having a number of taps greater than 9, which cannot be handled by the valnadd.8 instruction. Accordingly, first, for example, a case will be described where the filter arithmetic apparatus 11 performs a 16-tap symmetric filter arithmetic operation, with reference to FIGS. 16 and 17. FIGS. 16 and 17 are diagrams illustrating a symmetric filter arithmetic operation performed by the filter arithmetic apparatus 11 according to Embodiment 2 of the present invention in the case where the number of taps is 16.

First, a load instruction is issued to store pixel data [p0, p1, p2, p3, p4, p5, p6, p7] in the register R0 and pixel data [p8, p9, p10, p11, p12, p13, p14, p15] in the register R1, pixel data [p8, p9, p10, p11, p12, p13, p14, p15] in the register R2, and pixel data [p16, p17, p18, p19, p20, p21, p22, p23] in the register R3.

Next, an instruction "valnpadd.8 R4, R0, R1, R2, R3, 0" that is predetermined as an instruction used in the case where the number of filter taps is "16" is issued. In this case, the first data shuffling unit 201 reads a first data string containing [p0, p1, p2, p3, p4, p5, p6, p7] stored in the register R0 as a third data string and [p8, p9, p10, p11, p12, p13, p14, p15] stored in the register R1 as a fourth data string. Then, the first data shuffling unit 201 extracts [p0, p1, p2, p3, p4, p5, p6, p7], which is the data output in the case of the execution control signal indicating "8" shown in FIG. 13C, as the left-side data string (S102 in FIG. 5).

Also, the second data shuffling unit 202 reads a second data string containing [p8, p9, p10, p11, p12, p13, p14, p15] stored in the register R2 as a fifth data string and [p16, p17, p18, p19, p20, p21, p22, p23] stored in the register R3 as a sixth data string. Then, the second data shuffling unit 202 extracts [p15, p16, p17, p18, p19, p20, p21, p22], which is the data output in the case of the execution control signal indicating "8" shown in FIG. 13C, as the right-side data string (S104 in FIG. 5).

Figure 16:
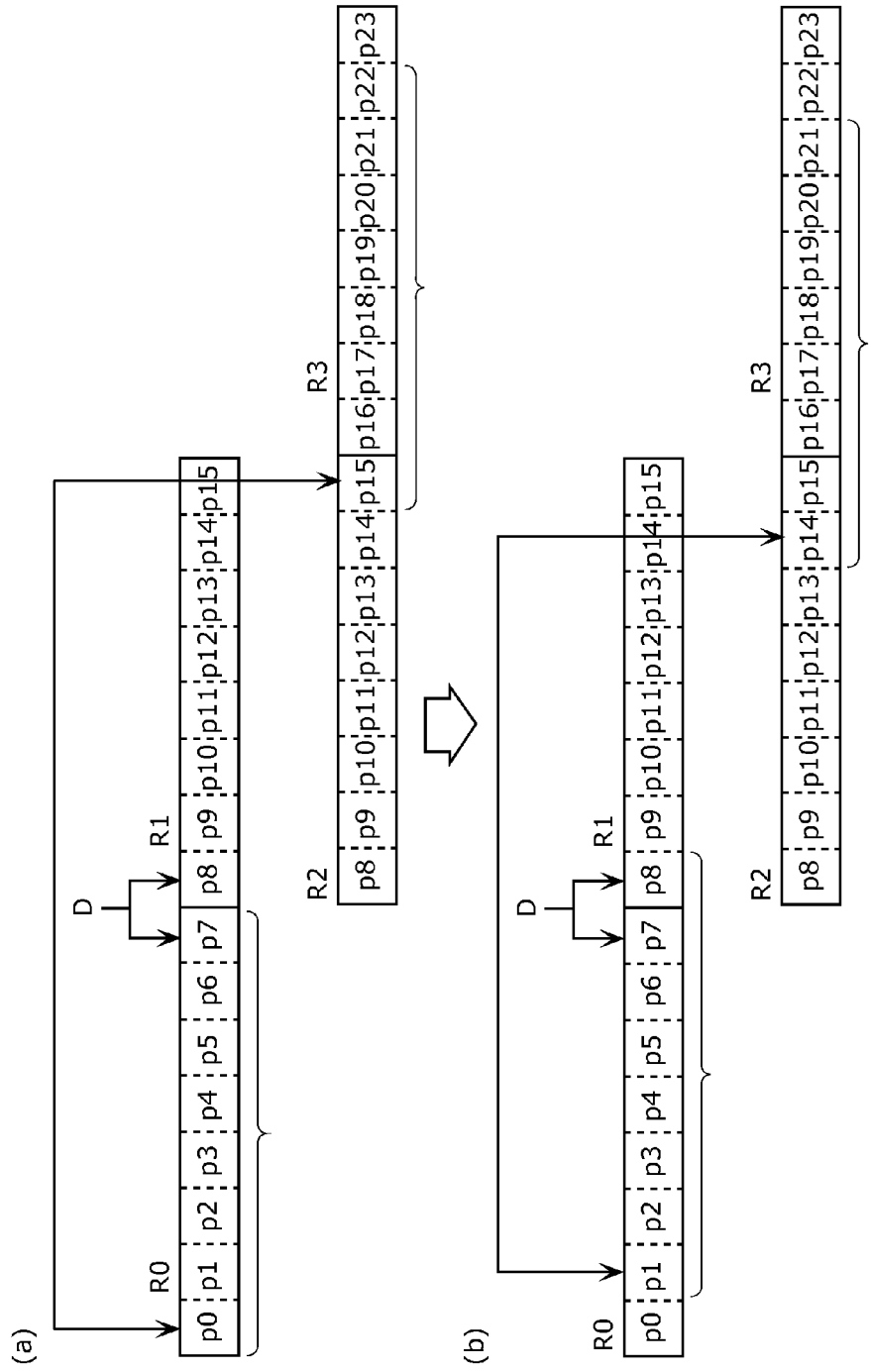
FIG. 16 is a diagram illustrating a symmetric filter arithmetic operation performed by the filter arithmetic apparatus according to Embodiment 2 of the present invention.

Specifically, as shown in (a) of FIG. 16, in the case where the number of taps of the filter arithmetic operation is an even number, the second data shuffling unit 202 reads the second data string containing the consecutive fifth data string and sixth data string from the register file 140 and extracts the right-side data string, such that data "p7, p8" positioned at the data string center D, which is the center between the head data "p0" of the third data string and the tail data "p15" of the fifth data string, is data to be multiplied by the central filter coefficient of the bilaterally symmetric filter coefficients.

Specifically, the first data shuffling unit 201 extracts the left-side data string [p0, p1, p2, p3, p4, p5, p6, p7] headed by data "p0" that is positioned on the left side of the data string center D (p7, p8). Also, the second data shuffling unit 202 extracts the right-side data string [p15, p16, p17, p18, p19, p20, p21, p22] headed by data "p15", which is the data positioned on the right side of the data string center D (p7, p8) and symmetric to the head data "p0" of the left-side data string with respect to the data string center D.

In this way, [p0, p1, p2, p3, p4, p5, p6, p7] and [p15, p16, p17, p18, p19, p20, p21, p22] that are pixel data to be multiplied by the filter coefficient k0 are extracted.

Finally, the extracted two pieces of pixel data are added up to calculate [p0+p15, p1+p16, p2+p17, p3+p18, p4+p19, p5+p20, p6+p21, p7+p22] that is stored in the register R4. This completes the operation according to the "valnpadd.8 R4, R0, R1, R2, R3, 0" instruction.

Next, an instruction "valnpadd.8 R5, R0, R1, R2, R3, 1" that is predetermined as the next instruction in the case where the number of filter taps is "16" is issued. In this case, the first data shuffling unit 201 reads the first data string and extracts [p1, p2, p3, p4, p5, p6, p7, p8], which is the data output in the case of the execution control signal indicating "9" shown in FIG. 13C, as the left-side data string. Also, the second data shuffling unit 202 reads the second data string, and extracts [p14, p15, p16, p17, p18, p19, p20, p21], which is the data output in the case of the execution control signal indicating "9" shown in FIG. 13C, as the right-side data string.

Specifically, as shown in (b) of FIG. 16, the first data shuffling unit 201 extracts the left-side data string [p1, p2, p3, p4, p5, p6, p7, p8] headed by data "p1" that is positioned on the left side of the data string center D (p7, p8). Also, the second data shuffling unit 202 extracts the right-side data string [p14, p15, p16, p17, p18, p19, p20, p21] headed by data "p14", which is the data positioned on the right side of the data string center D (p7, p8) and symmetric to the head data "p1" of the left-side data string with respect to the data string center D.

In this way, [p1, p2, p3, p4, p5, p6, p7, p8] and [p14, p15, p16, p17, p18, p19, p20, p21] that are pixel data to be multiplied by the filter coefficient k1.

Finally, the extracted two pieces of pixel data are added up to calculate [p1+p14, p2+p15, p3+p16, p4+p17, p5+p18, p6+p19, p7+p20, p8+p21] that is stored in R5. This completes the operation according to the "valnpadd.8 R5, R0, R1, R2, R3, 1" instruction.

Then, in the same manner as described above, next, an instruction "valnpadd.8 R6, R0, R1, R2, R3, 2" is issued, and the first data shuffling unit 201 extracts [p2, p3, p4, p5, p6, p7, p8, p9] as the left-side data string. Also, the second data shuffling unit 202 extracts [p13, p14, p15, p16, p17, p18, p19, p20] as the right-side data string. In this way, two pieces of pixel data to be multiplied by the filter coefficient k2 are extracted. Finally, the extracted two pieces of pixel data are added up, and the addition result is stored in the register R6.

Next, an instruction "valnpadd.8 R7, R0, R1, R2, R3, 3" is issued, and the first data shuffling unit 201 extracts [p3, p4, p5, p6, p7, p8, p9, p10] as the left-side data string. Also, the second data shuffling unit 202 extracts [p12, p13, p14, p15, p16, p17, p18, p19] as the right-side data string. In this way, two pieces of pixel data to be multiplied by the filter coefficient k3 are extracted. Finally, the extracted two pieces of pixel data are added up, and the addition result is stored in the register R7.

Next, an instruction "valnpadd.8 R8, R0, R1, R2, R3, 4" is issued, and the first data shuffling unit 201 extracts [p4, p5, p6, p7, p8, p9, p10, p11] as the left-side data string. Also, the second data shuffling unit 202 extracts [p11, p12, p13, p14, p15, p16, p17, p18] as the right-side data string. In this way, two pieces of pixel data to be multiplied by the filter coefficient k4 are extracted. Finally, the extracted two pieces of pixel data are added up, and the addition result is stored in the register R8.

Next, an instruction "valnpadd.8 R9, R0, R1, R2, R3, 5" is issued, and the first data shuffling unit 201 extracts [p5, p6, p7, p8, p9, p10, p11, p12] as the left-side data string. Also, the second data shuffling unit 202 extracts [p10, p11, p12, p13, p14, p15, p16, p17] as the right-side data string. In this way, two pieces of pixel data to be multiplied by the filter coefficient k5 are extracted. Finally, the extracted two pieces of pixel data are added up, and the addition result is stored in the register R9.

Next, an instruction "valnpadd.8 R10, R0, R1, R2, R3, 6" is issued, and the first data shuffling unit 201 extracts [p6, p7, p8, p9, p10, p11, p12, p13] as the left-side data string. Also, the second data shuffling unit 202 extracts [p9, p10, p11, p12, p13, p14, p15, p16] as the right-side data string. In this way, two pieces of pixel data to be multiplied by the filter coefficient k6 are extracted. Finally, the extracted two pieces of pixel data are added up, and the addition result is stored in the register R10.

Next, an instruction "valnpadd.8 R11, R0, R1, R2, R3, 7" is issued, and the first data shuffling unit 201 extracts [p7, p8, p9, p10, p11, p12, p13, p14] as the left-side data string. Also, the second data shuffling unit 202 extracts [p8, p9, p10, p11, p12, p13, p14, p15] as the right-side data string. In this way, two pieces of pixel data to be multiplied by the filter coefficient k7 are extracted. Finally, the extracted two pieces of pixel data are added up, and the addition result is stored in the register R11.

This completes the extraction and addition of pairs of pixel data that use the same filter coefficient in the symmetric filter arithmetic operation.

Next, the multiplier 180 calculates a multiplication data string by multiplying the addition data string calculated by the adder 170 by the left-side filter coefficient or the right-side filter coefficient (S108 in FIG. 5). Since the left-side filter coefficient and the right-side filter coefficient are the same value, the multiplier 180 can calculate the same multiplication data string by multiplying the addition data string by the left-side filter coefficient or by multiplying the addition data string by the right-side filter coefficient.

Specifically, as shown in FIG. 17, the multiplier 180 multiplies an addition data string R4 by the filter coefficient k0, an addition data string R5 by the filter coefficient k1, an addition data string R6 by the filter coefficient k2, an addition data string R7 by the filter coefficient k3, an addition data string R8 by the filter coefficient k4, an addition data string R9 by the filter coefficient k5, an addition data string R10 by the filter coefficient k6, and an addition data string R11 by the filter coefficient k7.

Then, the filter arithmetic apparatus 10 cumulatively adds the multiplication data strings calculated by the multiplier 180 and outputs the result of the symmetric filter arithmetic operation (S110 in FIG. 5). Specifically, as shown in FIG. 17, the filter arithmetic apparatus 10 can obtain a filter arithmetic operation result [q0, q1, q2, q3, q4, q5, q6, q7] by cumulatively adding the eight multiplication results calculated by the multiplier 180.

As described above, in the case where the number of taps of the filter arithmetic operation is an even number, when the content of the register R0 is represented by [r00, r01, r02, r03, r04, r05, r06, r07], and the content of the register R2 is represented by [r20, r21, r22, r23, r24, r25, r26, r27], for example, by loading the data such that the pixels at the positions that are symmetric with respect to the position of the center of symmetry of the filter coefficients in the case where the filter arithmetic operation result q0 is determined are stored in R0 and R2, it is possible to perform symmetric filter arithmetic operations having any great number of filter taps.

In addition to loading the data into R0 and R2, it is necessary to load the consecutive pieces of right-side data of the pixel data stored in R0 into R1, and load the consecutive pieces of right-side data of the image data stored in R2 into R3. Even if the number of filter taps is so large that all of the pixels required to perform a filter arithmetic operation cannot be stored in the four registers R0, R1, R2 and R3, the operation is possible by issuing the valnpadd.8 instruction while sequentially loading the pixels at the positions that are symmetric with respect to the center of symmetry of the filter coefficients into the registers in the same manner as described above.

Hereinafter, a symmetric filter arithmetic operation performed by the filter arithmetic apparatus 11 in the case where the number of taps is a large even number will be described in detail.

Figure 18:
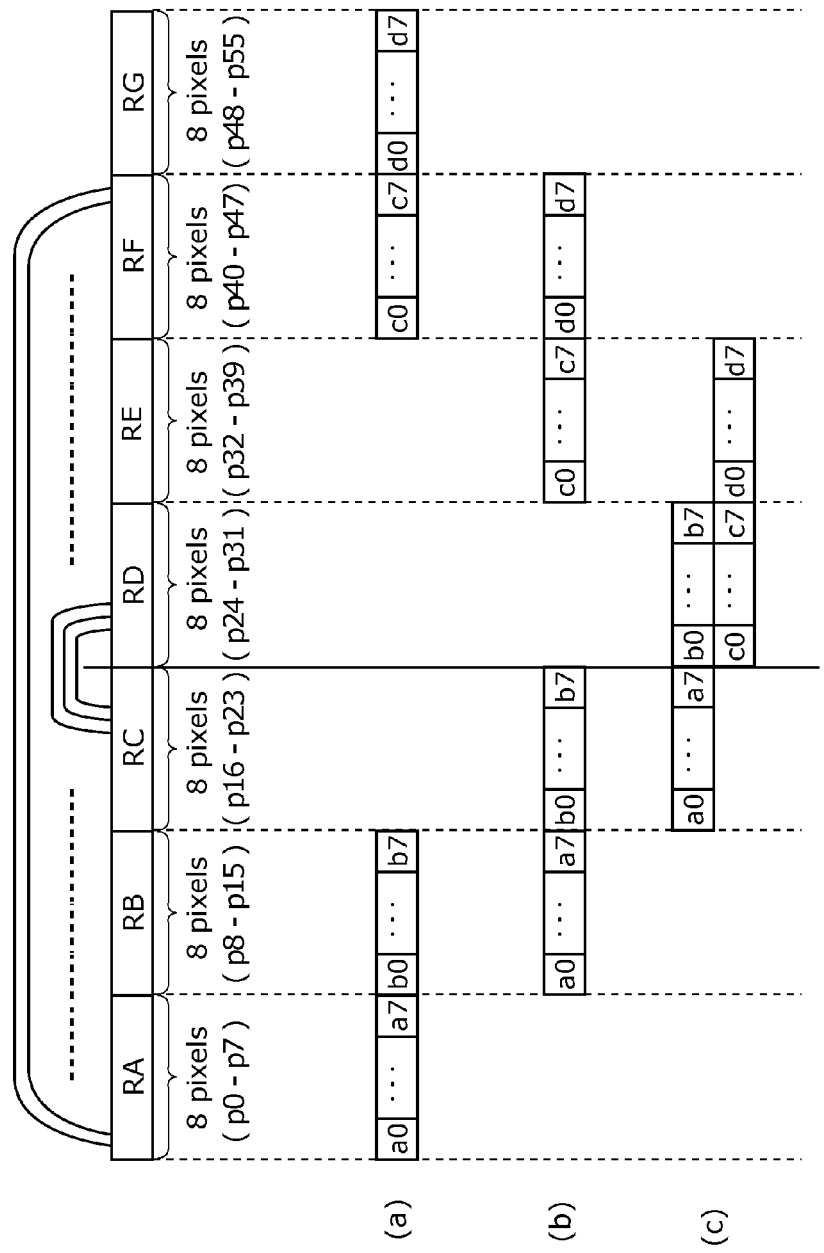
FIG. 18 is a diagram illustrating a symmetric filter arithmetic operation having 48 taps performed by the filter arithmetic apparatus according to Embodiment 2 of the present invention.

FIG. 18 is a diagram illustrating a symmetric filter arithmetic operation performed by the filter arithmetic apparatus 11 according to Embodiment 2 of the present invention in the case where the number of taps is 48.

As shown in the diagram, in the case where the number of taps of the filter arithmetic operation is an even number of 48, the filter arithmetic apparatus 11 extracts a left-side data string and a right-side data string that are two data strings headed by data that are bilaterally symmetric with respect to the data (the tail data of a data string RC and the head data of a data string RD) positioned at the center between the head data of a third data string and the tail data of a fifth data string. Because the number of taps of the filter arithmetic operation is an even number, data is extracted in accordance with the execution control signal indicating "8" to "15" shown in FIG. 13C.

Specifically, the filter arithmetic apparatus 11 extracts the left-side data string and the right-side data string and performs a symmetric filter arithmetic operation in three separate stages (a), (b) and (c) shown in FIG. 18.

First, in (a) of the diagram, the first data shuffling unit 201 reads a first data string containing consecutive data strings, namely, a third data string RA and a fourth data string RB, from the register file 140, and extracts a left-side data string headed by data positioned on the left side of the center of data string. For example, the first data shuffling unit 201 extracts a left-side data string [a0, a1, a2, a3, a4, a5, a6, a7] headed by the data "a0" of the third data string RA.

Also, the second data shuffling unit 202 reads a second data string containing consecutive data strings, namely, a fifth data string RF and a sixth data string RG, from the register file 140 and extracts a right-side data string, such that the data (the tail data of the data string RC and the head data of the data string RD) positioned at the center is data to be multiplied by the filter coefficient at the center of the bilaterally symmetric filter coefficients.

Specifically, the second data shuffling unit 202 extracts the right-side data string headed by data that is the data positioned on the right side of the center of data string and symmetric to the head data of the left-side data string with respect to the center of data string. For example, the second data shuffling unit 202 extracts a right-side data string [c7, d0, d1, d2, d3, d4, d5, d6] headed by the tail data "c7" of the fifth data string RF.

Then, in the same manner as above, the first data shuffling unit 201 extracts a left-side data string [a1, a2, a3, a4, a5, a6, a7, b0], and the second data shuffling unit 202 extracts a right-side data string [c6, c7, d0, d1, d2, d3, d4, d5]. Then, data is sequentially extracted in the same manner, and finally, the first data shuffling unit 201 extracts a left-side data string [a7, b0, b1, b2, b3, b4, b5, b6], and the second data shuffling unit 202 extracts a right-side data string [c0, c1, c2, c3, c4, c5, c6, c7].

Next, in (b) of the diagram, the first data shuffling unit 201 reads a first data string containing consecutive data strings, namely, a third data string RB and a fourth data string RC, from the register file 140, and extracts, for example, a left-side data string [a0, a1, a2, a3, a4, a5, a6, a7] headed by data "a0" of the third data string RB.

Also, the second data shuffling unit 202 reads a second data string containing consecutive data strings, namely, a fifth data string RE and a sixth data string RF, from the register file 140, and extracts, for example, a right-side data string [c7, d0, d1, d2, d3, d4, d5, d6] headed by the tail data "c7" of the fifth data string RE Then, in the same manner as above, the first data shuffling unit 201 performs extraction until it extracts a left-side data string [a7, b0, b1, b2, b3, b4, b5, b6], and the second data shuffling unit 202 performs extraction until it extracts a right-side data string [c0, c1, c2, c3, c4, c5, c6, c7].

Next, in (c) of the diagram, the first data shuffling unit 201 reads a first data string containing consecutive data strings, namely, a third data string RC and a fourth data string RD from the register file 140, and extracts, for example, a left-side data string [a0, a1, a2, a3, a4, a5, a6, a7] headed by the data "a0" of the third data string RC.

Also, the second data shuffling unit 202 reads a second data string containing consecutive data strings, namely, a fifth data string RD and a sixth data string RE, from the register file 140, and extracts, for example, a right-side data string [c7, d0, d1, d2, d3, d4, d5, d6] headed by the tail data "c7" of the fifth data string RD.

Then, in the same manner as above, the first data shuffling unit 201 performs extraction until it extracts a left-side data string [a7, b0, b1, b2, b3, b4, b5, b6], and the second data shuffling unit 202 performs extraction until it extracts a right-side data string [c0, c1, c2, c3, c4, c5, c6, c7].

Since all of the paired data strings are extracted through the above processing, each extracted pair of data strings are added up and multiplied by the corresponding filter coefficient, and the results are cumulatively added.

Figure 19:
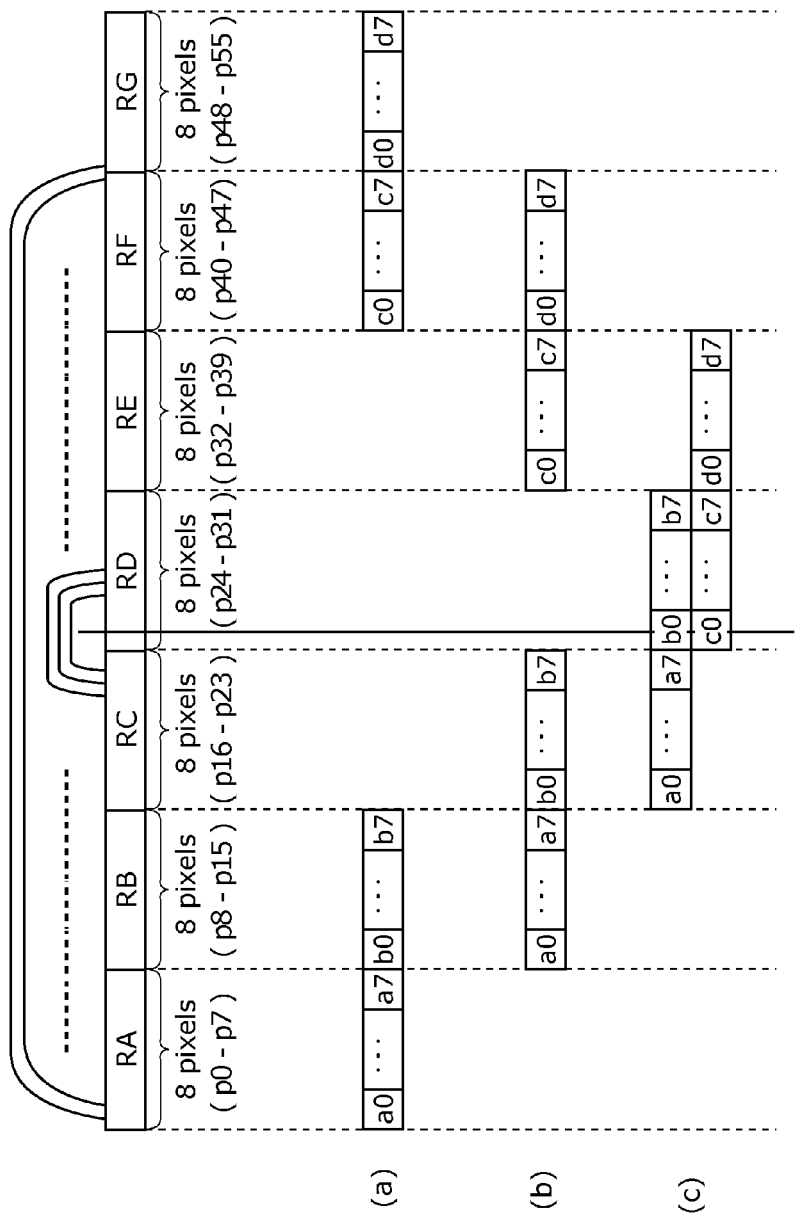
FIG. 19 is a diagram illustrating a symmetric filter arithmetic operation having 49 taps performed by the filter arithmetic apparatus according to Embodiment 2 of the present invention.

Next, a symmetric filter arithmetic operation performed by the filter arithmetic apparatus 11 in the case where the number of taps is a large odd number will be described in detail. FIG. 19 is a diagram illustrating a symmetric filter arithmetic operation performed by the filter arithmetic apparatus 11 according to Embodiment 2 of the present invention in the case where the number of taps is 49.

As shown in the diagram, in the case where the number of taps of the filter arithmetic operation is an odd number of 49, the filter arithmetic apparatus 11 extracts a left-side data string and a right-side data string that are two data strings headed by data that are bilaterally symmetric with respect to the data (the head data of a data string RD) positioned at the center between the head data of a third data string and the tail data of a sixth data string. Because the number of taps of the filter arithmetic operation is an odd number, data is extracted in accordance with the execution control signal indicating "16" to "23" shown in FIG. 13C.

Specifically, the filter arithmetic apparatus 11 extracts the left-side data string and the right-side data string and performs a symmetric filter arithmetic operation in three separate stages (a), (b) and (c) shown in FIG. 18.

First, in (a) of the diagram, the first data shuffling unit 201 reads a first data string containing consecutive data strings, namely, a third data string RA and a fourth data string RB, from the register file 140, and extracts a left-side data string headed by data positioned on the left side of the center of data string. For example, the first data shuffling unit 201 extracts a left-side data string [a0, a1, a2, a3, a4, a5, a6, a7] headed by the data "a0" of the third data string RA.

Also, the second data shuffling unit 202 reads a second data string containing consecutive data strings, namely, a fifth data string RF and a sixth data string RG, from the register file 140 and extracts a right-side data string such that the data (the head data of a data string RD) positioned at the center is data to be multiplied by the filter coefficient at the center of the bilaterally symmetric filter coefficients.

Specifically, the second data shuffling unit 202 extracts the right-side data string headed by data that is the data positioned on the right side of the center of data string and symmetric to the head data of the left-side data string with respect to the center of data string. For example, the second data shuffling unit 202 extracts a right-side data string [d0, d1, d2, d3, d4, d5, d6, d7] headed by the head data "d0" of the fifth data string RG.

Then, in the same manner as above, the first data shuffling unit 201 extracts a left-side data string [a1, a2, a3, a4, a5, a6, a7, b0], and the second data shuffling unit 202 extracts a right-side data string [c7, d0, d1, d2, d3, d4, d5, d6]. Then, data is sequentially extracted in the same manner, and finally, the first data shuffling unit 201 extracts a left-side data string [a7, b0, b1, b2, b3, b4, b5, b6], and the second data shuffling unit 202 extracts a right-side data string [c1, c2, c3, c4, c5, c6, c7, d0].

Next, in (b) of the diagram, the first data shuffling unit 201 reads a first data string containing consecutive data strings, namely, a third data string RB and a fourth data string RC from the register file 140, and extracts, for example, a left-side data string [a0, a1, a2, a3, a4, a5, a6, a7] headed by the data "a0" of the third data string RB.

Also, the second data shuffling unit 202 reads a second data string containing consecutive data strings, namely, a fifth data string RE and a sixth data string RF from the register file 140, and extracts, for example, a right-side data string [d0, d1, d2, d3, d4, d5, d6, d7] headed by the head data "d0" of the sixth data string RF.

Then, in the same manner as above, the first data shuffling unit 201 performs extraction until it extracts a left-side data string [a7, b0, b1, b2, b3, b4, b5, b6], and the second data shuffling unit 202 performs extraction until it extracts a right-side data string [c1, c2, c3, c4, c5, c6, c7, d0].

Next, in (c) of the diagram, the first data shuffling unit 201 reads a first data string containing consecutive data strings, namely, a third data string RC and a fourth data string RD, from the register file 140, and extracts, for example, a left-side data string [a0, a1, a2, a3, a4, a5, a6, a7] headed by the data "a0" of the third data string RC.

Also, the second data shuffling unit 202 reads a second data string containing consecutive data strings, namely, a fifth data string RD and a sixth data string RE, from the register file 140, and extracts, for example, a right-side data string [d0, d1, d2, d3, d4, d5, d6, d7] headed by the head data "d0" of the sixth data string RE.

Then, in the same manner as above, the first data shuffling unit 201 performs extraction until it extracts a left-side data string [a7, b0, b1, b2, b3, b4, b5, b6], and the second data shuffling unit 202 performs extraction until it extracts a right-side data string [c1, c2, c3, c4, c5, c6, c7, d0]. Also, the first data shuffling unit 201 extracts a data string [b0, b1, b2, b3, b4, b5, b6, b7] that is multiplied by the central filter coefficient.

Since all of the paired data strings are extracted through the above processing, each extracted pair of data strings are added up and multiplied by the corresponding filter coefficient, and the results are cumulatively added.

As discussed above, according to the filter arithmetic apparatus 11 of Embodiment 2, in the case where the number of taps of the filter arithmetic operation is an even number, a left-side data string is extracted from a first data string containing consecutive data strings, namely, a third data string and a fourth data string, and a right-side data string is extracted from a second data string containing consecutive data strings, namely, a fifth data string and a sixth data string, such that the data positioned at the center between the head data of the third data string and the tail data of the fifth data string is data to be multiplied by the central filter coefficient. Also, in the case where the number of taps of the filter arithmetic operation is an odd number, the left-side data string and the right-side data string are extracted, such that the data positioned at the center between the head data of the third data string and the head data of the sixth data string is data to be multiplied by the central filter coefficient.

With this configuration, it is possible to extract the left-side data string and the right-side data string and perform the symmetric filter arithmetic operation by storing a part of the data in two buffers, in a manner whereby a first data string is stored in one of the buffers and a second data string is stored in the other buffer, and the left-side data string is extracted from the one buffer and the right-side data string is extracted from the other buffer.

That is, even when the number of taps of the symmetric filter arithmetic operation is large, a part of the data is stored in two separate buffers. It is thereby possible to perform the symmetric filter arithmetic operation having a large number of taps, without storing all of the data used in the symmetric filter arithmetic operation in a buffer, and therefore symmetric filter arithmetic operations corresponding to various numbers of taps can be performed with a processor. The present embodiment has been described assuming that the buffer is a plurality of registers, but the buffer is not limited to registers. The buffer may be, for example, a part of the area of a data memory.

Also, the left-side data string and the right-side data string are extracted such that the head data of the left-side data string and the head data of the right-side data string are bilaterally symmetric with respect to the center of data string. It is thereby possible to extract pairs of data strings that are multiplied by the same filter coefficient. Accordingly, by extracting pairs of data strings corresponding to the number of taps, symmetric filter arithmetic operations corresponding to various numbers of taps can be performed by using a processor.

Also, the third data string and the fourth data string, or the fifth data string and the sixth data string are stored in registers having consecutive numbers. It is thereby possible to simplify an instruction code for performing a symmetric filter arithmetic operation and reduce the bit fields of the registers in the instruction code.

Also, in the embodiments given above, the constituent elements may be configured by dedicated hardware or a software program suitable for the constituent elements. The constituent elements may be implemented by a program executing unit such as a CPU or a processor reading out and executing a software program recorded in a recording medium such as a hard disk or a semiconductor memory.

Specifically, the constituent elements of the symmetric filter arithmetic apparatus shown in FIG. 1 or 10 may be implemented by software. The software that implements the symmetric filter arithmetic apparatus of each of the above embodiments is a program that causes a computer to execute the steps of the following symmetric filter arithmetic method. Specifically, this symmetric filter arithmetic method is a symmetric filter arithmetic method for performing a filter arithmetic operation on a plurality of pieces of data stored in a storage unit by using bilaterally symmetric filter coefficients, the method including: reading a first data string that is a plurality of consecutive pieces of data from the storage unit, and extracting, from the first data string, a left-side data string that is a plurality of consecutive pieces of data to be multiplied by a left-side filter coefficient that is a filter coefficient on a left side of a center of the bilaterally symmetric filter coefficients; and reading a second data string that is a plurality of consecutive pieces of data from the storage unit, and extracting, from the second data string, a right-side data string that is a plurality of consecutive pieces of data to be multiplied by a right-side filter coefficient that is a filter coefficient on a right side of the center and is the same value as the left-side filter coefficient.

Such a program can be distributed via recording media such as CD-ROM and transmission media such as the Internet.

Also, the present invention can be implemented as integrated circuits (LSIs) including characteristic processing units of the symmetric filter arithmetic apparatus. They may be individual chips, or may be partially or wholly integrated into a single chip. Specifically, for example, all of the functional blocks, excluding the memories, of the symmetric filter arithmetic apparatus shown in FIG. 1 or 10 may be integrated into a single chip.

While the above example has been discussed using an LSI, the LSI may be called an IC, a system LSI, a super LSI, or an ultra LSI according to the degree of integration.

The method for implementing an integrated circuit is not limited to an LSI, and the integration circuit may be implemented by a dedicated circuit or a general-purpose processor. It is also possible to use an FPGA (Field Programmable Gate Array) that can be programmed after LSI production or a reconfigurable processor that enables reconfiguration of the connection and setting of circuit cells in the LSI.

Furthermore, if a technique for implementing an integrated circuit that can replace LSIs appears by another technique resulting from the progress or derivation of semiconductor technology, the functional blocks may of course be integrated by using that technique. Application of biotechnology or the like is possible.

The filter arithmetic apparatus according to the present invention has been described above by way of the embodiments given above, but the present invention is not limited thereto.

In other words, the embodiments disclosed herein are considered in all respects as illustrative and not restrictive. The scope of the invention is indicated by the appended claims rather than by the foregoing description. All variations and modifications falling within the equivalency range of the appended claims are intended to be embraced therein.

For example, Embodiments 1 and 2 given above were described taking 8-bit pixel data as an example, but pixel data other than 8-bit pixel data may be used. Also, an example was described in which eight pieces of pixel data are stored in a single register, but the number of pieces of pixel data may be a number other than 8. As described in Embodiments 1 and 2, by using a configuration in which the pixel(s) at the center of symmetry of the filter coefficients are stored in a predetermined position in the register, it is possible to handle cases where the number of pixels stored in a single register is a number other than 8.

Also, in Embodiments 1 and 2 given above, the filter arithmetic apparatus is configured to perform a symmetric filter arithmetic operation on pixel data, but the data on which the symmetric filter arithmetic operation is performed is not limited to pixel data, and may be data other than image data such as audio data.

Also, in Embodiments 1 and 2 given above, in the instruction mnemonics for performing the symmetric filter arithmetic operation, two registers having consecutive numbers are represented by "Rc: Rc+1", "Ra, Ra+1" and "Rb, Rb+1", but may be represented by different names. For example, if one of two registers having consecutive numbers is represented by a different name such as register X, the 32 registers R0 to R31, each of 64 bits, can be represented by 16 registers X0 to X15, each of 128 bits. In this case, "Rc: Rc+1" can be represented by "Xc", "Ra, Ra+1" can be represented by "Xa", and "Rb, Rb+1" can be represented by "Xb".

Also, in Embodiment 2 given above, the valnpadd.8 instruction is used for a symmetric filter having a number of taps greater than 9, which cannot be processed with the valnadd.8 instruction of Embodiment 1. However, the valnpadd.8 instruction can be used for a symmetric filter having a number of taps less than 9, and thus in Embodiment 2 given above, the valnpadd.8 instruction may be used regardless of the number of taps.

The symmetric filter arithmetic apparatus according to the present invention is useful for performing symmetric filter arithmetic processing. The filter arithmetic operation of image data is one of the basic arithmetic operations of image processing, and the present invention is applicable with various devices that perform image processing. The present invention is applicable to, for example, information display devices and image capturing devices such as televisions, digital video recorders, automotive navigation systems, mobile phones, digital cameras, and digital video cameras.

[Reference Signs List]

10, 11, 20 Filter arithmetic apparatus (symmetric filter arithmetic apparatus)
110 Instruction memory
120 Instruction fetch unit
130 Instruction decoder
140 Register file
150 Memory access unit
160 Data shuffler
161 First data shuffling unit
162 Second data shuffling unit
170 Adder
180 Multiplier
190 Data memory
200 Data shuffler
201 First data shuffling unit
202 Second data shuffling unit
300 Buffer
310 Selector
321 to 324 Filter arithmetic unit

The invention claimed is:

1. A symmetric filter arithmetic apparatus that performs a filter arithmetic operation on a plurality of pieces of data stored in a storage unit by using bilaterally symmetric filter coefficients, the apparatus comprising:

a non-transitory memory storing a program; and
a hardware processor configured to execute the program and cause the symmetric filter arithmetic apparatus to operates as:
a left-side data string extraction unit configured to read, from the storage unit, a first data string that is a plurality of consecutive pieces of data, and extract, from the first data string, a left-side data string that is a plurality of consecutive pieces of data to be multiplied by a left-side filter coefficient that is a filter coefficient on a left side of a center of the bilaterally symmetric filter coefficients; and
a right-side data string extraction unit configured to read, from the storage unit, a second data string that is a plurality of consecutive pieces of data, and extract, from the second data string, a right-side data string that is a plurality of consecutive pieces of data to be multiplied by a right-side filter coefficient that is a filter coefficient on a right side of the center and is the same value as the left-side filter coefficient, wherein the left-side data string extraction unit is configured to read, from the storage unit, the first data string including a third data string and a fourth data string that are consecutive data strings, and extract the left-side data string, and the right-side data string extraction unit is configured to:
(a) read, from the storage unit, the second data string including a fifth data string and a sixth data string that are consecutive data strings, and extract the right-side data string, such that data positioned at a center of data string that is a center between head data of the third data string and tail data of the fifth data string is data to be multiplied by a filter coefficient at the center of the bilaterally symmetric filter coefficients; or
(b) read, from the storage unit, the second data string including the consecutive fifth data string and sixth data string, and extract the right-side data string, such that data positioned at a center of data string that is a center between the head data of the third data string and head data of the sixth data string is data to be multiplied by the filter coefficient at the center of the bilaterally symmetric filter coefficients, and wherein the symmetric filter arithmetic operation is performed using the left-side data string extraction unit and the right-side data string extraction unit so as to accommodate a various number of taps.

2. The symmetric filter arithmetic apparatus according to claim 1, further comprising:
an addition unit configured to calculate an addition data string by adding up the left-side data string and the right-side data string that have been extracted; and
a multiplication unit configured to calculate a multiplication data string by multiplying the calculated addition data string by the left-side filter coefficient or the right-side filter coefficient.

3. The symmetric filter arithmetic apparatus according to claim 1,
wherein the left-side data string extraction unit is configured to extract the left-side data string headed by data on the left side of the center of data string, and
the right-side data string extraction unit is configured to extract the right-side data string headed by data that is data on the right side of the center of data string and symmetric to the head data of the left-side data string with respect to the center of data string.

4. The symmetric filter arithmetic apparatus according to claim 1,
wherein the third data string and the fourth data string, or the fifth data string and the sixth data string are stored in consecutive areas in the storage unit,
the left-side data string extraction unit is configured to read the first data string from the storage unit and extract the left-side data string, and
the right-side data string extraction unit is configured to read the second data string from the storage unit and extract the right-side data string.

5. A symmetric filter arithmetic apparatus that performs a filter arithmetic operation on a plurality of pieces of data stored in a storage unit by using bilaterally symmetric filter coefficients, the apparatus comprising:
a non-transitory memory storing a program; and
a hardware processor configured to execute the program and cause the symmetric filter arithmetic apparatus to operates as:
a left-side data string extraction unit configured to read, from the storage unit, a first data string that is a plurality of consecutive pieces of data, and extract, from the first data string, a left-side data string that is a plurality of consecutive pieces of data to be multiplied by a left-side filter coefficient that is a filter coefficient on a left side of a center of the bilaterally symmetric filter coefficients; and a right-side data string extraction unit configured to read, from the storage unit, a second data string that is a plurality of consecutive pieces of data, and extract, from the second data string, a right-side data string that is a plurality of consecutive pieces of data to be multiplied by a right-side filter coefficient that is a filter coefficient on a right side of the center and is the same value as the left-side filter coefficient, wherein the left-side data string extraction unit is configured to read, from the storage unit, the first data string including a third data string and a fourth data string that are consecutive data strings, and extract the left-side data string, and the right-side data string extraction unit is configured to read the first data string from the storage unit as the second data string and extract the right-side data string, such that data positioned at a center of data string that is a center of the third data string is data to be multiplied by a filter coefficient at the center of the bilaterally symmetric filter coefficients, and wherein the symmetric filter arithmetic operation is performed using the left-side data string extraction unit and the right-side data string extraction unit so as to accommodate a various number of taps.

6. The symmetric filter arithmetic apparatus according to claim 5,
wherein a center between head data of the third data string and tail data of the third data string is set as the center of data string, or a center between the head data of the third data string and head data of the fourth data string is set as the center of data string,
the left-side data string extraction unit is configured to extract the left-side data string headed by data on a left side of the center of data string, and
the right-side data string extraction unit is configured to extract the right-side data string headed by data that is data on a right side of the center of data string and symmetric to the head data of the left-side data string with respect to the center of data string.

7. A symmetric filter arithmetic method of a symmetric filter arithmetic apparatus for performing a filter arithmetic operation on a plurality of pieces of data stored in a storage unit by using bilaterally symmetric filter coefficients, the method comprising:
reading, from the storage unit, a first data string that is a plurality of consecutive pieces of data, and extracting, from the first data string, a left-side data string that is a plurality of consecutive pieces of data to be multiplied by a left-side filter coefficient that is a filter coefficient on a left side of a center of the bilaterally symmetric filter coefficients; and
reading, from the storage unit, a second data string that is a plurality of consecutive pieces of data, and extracting, from the second data string, a right-side data string that is a plurality of consecutive pieces of data to be multiplied by a right-side filter coefficient that is a filter coefficient on a right side of the center and is the same value as the left-side filter coefficient,
wherein the left-side data string extraction step reads, from the storage unit, the first data string including a third data string and a fourth data string that are consecutive data strings, and extract the left-side data string, and the right-side data string extraction step:
(a) reads, from the storage unit, the second data string including a fifth data string and a sixth data string that are consecutive data strings, and extract the right-side data string, such that data positioned at a center of data string that is a center between head data of the third data string and tail data of the fifth data string is data to be multiplied by a filter coefficient at the center of the bilaterally symmetric filter coefficients; or
(b) reads, from the storage unit, the second data string including the consecutive fifth data string and sixth data string, and extract the right-side data string, such that data positioned at a center of data string that is a center between the head data of the third data string and head data of the sixth data string is data to be multiplied by the filter coefficient at the center of the bilaterally symmetric filter coefficients, and wherein the symmetric filter arithmetic apparatus includes a non-transitory memory storing a program, and a hardware processor configured to execute the program and cause the symmetric filter arithmetic apparatus to perform the symmetric filter arithmetic method, and wherein the symmetric filter arithmetic operation is performed using the left-side data string extraction step and the right-side data string extraction step so as to accommodate a various number of taps.

8. A non-transitory computer-readable recording medium on which a program is recorded in a symmetric filter arithmetic apparatus, the program for performing a filter arithmetic operation on a plurality of pieces of data stored in a storage unit by using bilaterally symmetric filter coefficients, the program causing the symmetric filter arithmetic apparatus to:

read, from the storage unit, a first data string that is a plurality of consecutive pieces of data, and extract, from the first data string, a left-side data string that is a plurality of consecutive pieces of data to be multiplied by a left-side filter coefficient that is a filter coefficient on a left side of a center of the bilaterally symmetric filter coefficients; and read, from the storage unit, a second data string that is a plurality of consecutive pieces of data, and extract, from the second data string, a right-side data string that is a plurality of consecutive pieces of data to be multiplied by a right-side filter coefficient that is a filter coefficient on a right side of the center and is the same value as the left-side filter coefficient, wherein the left-side data string extraction step reads, from the storage unit, the first data string including a third data string and a fourth data string that are consecutive data strings, and extract the left-side data string, and the right-side data string extraction step:
(a) reads, from the storage unit, the second data string including a fifth data string and a sixth data string that are consecutive data strings, and extract the right-side data string, such that data positioned at a center of data string that is a center between head data of the third data string and tail data of the fifth data string is data to be multiplied by a filter coefficient at the center of the bilaterally symmetric filter coefficients; or
(b) reads, from the storage unit, the second data string including the consecutive fifth data string and sixth data string, and extract the right-side data string, such that data positioned at a center of data string that is a center between the head data of the third data string and head data of the sixth data string is data to be multiplied by the filter coefficient at the center of the bilaterally symmetric filter coefficients, and wherein the symmetric filter arithmetic operation is performed using the left-side data string extraction step and the right-side data string extraction step so as to accommodate a various number of taps.

* * * * *